(12) United States Patent
Obata et al.

(10) Patent No.: US 10,982,316 B2
(45) Date of Patent: Apr. 20, 2021

(54) VAPOR DEPOSITION MASK, FRAME-EQUIPPED VAPOR DEPOSITION MASK, VAPOR DEPOSITION MASK PREPARATION BODY, VAPOR DEPOSITION PATTERN FORMING METHOD, METHOD FOR PRODUCING ORGANIC SEMICONDUCTOR ELEMENT, AND METHOD FOR PRODUCING ORGANIC EL DISPLAY

(71) Applicant: Dai Nippon Printing Co., Ltd., Tokyo (JP)

(72) Inventors: Katsunari Obata, Tokyo (JP); Yasuko Sone, Tokyo (JP); Kumiko Hokari, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 16/333,366

(22) PCT Filed: Sep. 27, 2017

(86) PCT No.: PCT/JP2017/035012
§ 371 (c)(1),
(2) Date: Mar. 14, 2019

(87) PCT Pub. No.: WO2018/062300
PCT Pub. Date: Apr. 5, 2018

(65) Prior Publication Data
US 2019/0211437 A1    Jul. 11, 2019

(30) Foreign Application Priority Data

Sep. 30, 2016  (JP) .............................. JP2016-194252
Jun. 19, 2017  (JP) .............................. JP2017-119666

(51) Int. Cl.
*C23C 14/04* (2006.01)
*C23C 16/44* (2006.01)
(Continued)

(52) U.S. Cl.
CPC .......... *C23C 14/042* (2013.01); *C23C 16/042* (2013.01); *C23C 16/44* (2013.01);
(Continued)

(58) Field of Classification Search
CPC ..... C23C 14/042; C23C 14/24; C23C 16/042; C23C 14/04; C23C 14/12
See application file for complete search history.

(56) References Cited

U.S. PATENT DOCUMENTS

2014/0199808 A1    7/2014  Sugimoto et al.
2014/0377903 A1*  12/2014  Takeda ...................... C23F 1/02
                                                          438/99
(Continued)

FOREIGN PATENT DOCUMENTS

JP    2009-249706 A1    10/2009
JP    2013-173968 A1     9/2013
(Continued)

OTHER PUBLICATIONS

International Search Report and Written Opinion (Application No. PCT/JP2017/035012) dated Dec. 19, 2017.

*Primary Examiner* — Tony Tran
(74) *Attorney, Agent, or Firm* — Burr & Brown, PLLC

(57) ABSTRACT

There is provided a vapor deposition mask including: a resin mask including a resin mask opening corresponding to a pattern to be produced by vapor deposition; and a metal layer partially positioned on one surface of the resin mask.

5 Claims, 16 Drawing Sheets

(51) Int. Cl.
- *H01L 27/32* (2006.01)
- *H01L 51/50* (2006.01)
- *H01L 51/00* (2006.01)
- *C23C 16/04* (2006.01)
- *H01L 51/56* (2006.01)

(52) U.S. Cl.
CPC ...... *H01L 27/3244* (2013.01); *H01L 51/0011* (2013.01); *H01L 51/5012* (2013.01); *H01L 51/56* (2013.01)

(56) References Cited

U.S. PATENT DOCUMENTS

| | | | |
|---|---|---|---|
| 2015/0017759 A1* | 1/2015 | Hirobe | H01L 51/56 438/99 |
| 2015/0037928 A1 | 2/2015 | Hirobe et al. | |
| 2016/0168691 A1 | 6/2016 | Takeda et al. | |
| 2016/0288163 A1 | 10/2016 | Mizumura | |
| 2017/0244035 A1 | 8/2017 | Kawato et al. | |
| 2017/0244036 A1 | 8/2017 | Okawara | |
| 2017/0362698 A1 | 12/2017 | Kobayashi et al. | |

FOREIGN PATENT DOCUMENTS

| | | |
|---|---|---|
| JP | 5288072 B2 | 9/2013 |
| JP | 5288073 B2 | 9/2013 |
| JP | 5288074 B2 | 9/2013 |
| JP | 2014-218735 A1 | 11/2014 |
| JP | 2015-028194 A1 | 2/2015 |
| JP | 6163376 B2 | 7/2017 |
| JP | 2017-150017 A1 | 8/2017 |
| WO | 2015/087936 A1 | 6/2015 |
| WO | 2016/060216 A1 | 4/2016 |
| WO | 2016/088632 A1 | 6/2016 |

* cited by examiner

VAPOR DEPOSITION MASK, FRAME-EQUIPPED VAPOR DEPOSITION MASK, VAPOR DEPOSITION MASK PREPARATION BODY, VAPOR DEPOSITION PATTERN FORMING METHOD, METHOD FOR PRODUCING ORGANIC SEMICONDUCTOR ELEMENT, AND METHOD FOR PRODUCING ORGANIC EL DISPLAY

BACKGROUND OF THE INVENTION

1. Field of the Invention

Embodiments of the present disclosure relate to a vapor deposition mask, a frame-equipped vapor deposition mask, a vapor deposition mask preparation body, a vapor deposition pattern forming method, a method for producing an organic semiconductor element, and a method for producing an organic EL display.

2. Description of Related Art

Formation of a vapor deposition pattern using a vapor deposition mask is typically performed by bringing the vapor deposition mask in which openings corresponding to the pattern to be produced by vapor deposition are provided into close contact with a vapor deposition target, and causing a vapor deposition material released from a vapor deposition source to adhere to the vapor deposition target through the openings. Moreover, the vapor deposition mask is often fixed to a frame and used as a frame-equipped vapor deposition mask.

As the aforementioned vapor deposition mask used for forming a vapor deposition pattern, there are known, for example, vapor deposition masks each including: a resin mask including resin mask openings corresponding to a pattern to be produced by vapor deposition; and a metal mask including a metal mask opening (sometimes referred to as slit), the resin mask and the metal mask being stacked (for example, Patent Documents 1 to 5).

CITATION LIST

Patent Document

Patent Document 1: Japanese Patent No. 5288072
Patent Document 2: Japanese Patent No. 5288073
Patent Document 3: Japanese Patent No. 5288074
Patent Document 4: Japanese Patent Laid-Open No. 2014-218735
Patent Document 5: Japanese Patent No. 6163376

SUMMARY OF INVENTION

Technical Problem

A primary object of an embodiment of the present disclosure is to provide a vapor deposition mask and the like which can form a vapor deposition pattern with high definition.

Solution to Problem

A vapor deposition mask according to an embodiment of the present disclosure includes: a resin mask including a resin mask opening corresponding to a pattern to be produced by vapor deposition; and a metal layer partially positioned on one surface of the resin mask. In the vapor deposition mask, the resin mask may exhibit a quadrangle with a long side and a short side, and the metal layer may be in a band shape along the long side of the resin mask.

A frame-equipped vapor deposition mask according to another embodiment of the present disclosure includes: the vapor deposition mask according to an embodiment of the present disclosure; and a frame, wherein the vapor deposition mask is fixed to the frame via the metal layer. Moreover, a frame-equipped vapor deposition mask according to another embodiment of the present disclosure includes: the vapor deposition mask according to an embodiment of the present disclosure; and a frame, wherein the vapor deposition mask is fixed to the frame via the resin mask. Moreover, a frame-equipped vapor deposition mask according to another embodiment of the present disclosure includes: the vapor deposition mask according to an embodiment of the present disclosure; and a frame, wherein the vapor deposition mask is fixed to the frame via both the resin mask and the metal layer.

A vapor deposition mask preparation body according to another embodiment of the present disclosure is a vapor deposition mask preparation body for producing the vapor deposition mask according to an embodiment of the present disclosure, the vapor deposition mask preparation body including: a resin plate; and metal layer partially positioned on one surface of the resin plate.

Moreover, in a vapor deposition pattern producing method according to another embodiment of the present disclosure, a vapor deposition mask used is the vapor deposition mask according to an embodiment of the present disclosure.

A method for producing an organic semiconductor element according to another embodiment of the present disclosure includes a vapor deposition pattern forming step of forming a vapor deposition pattern on a vapor deposition target using a vapor deposition mask, wherein the vapor deposition mask used in the vapor deposition pattern forming step is the vapor deposition mask according to an embodiment of the present disclosure.

Moreover, in an organic EL display producing method according to another embodiment of the present disclosure, an organic semiconductor element produced by the aforementioned method for producing the organic semiconductor element according to an embodiment of the present disclosure is used.

Advantageous Effects

According to the vapor deposition mask and the like of the present disclosure, a vapor deposition pattern with high definition can be formed.

DETAILED DESCRIPTION OF THE INVENTION

Figure 1A:
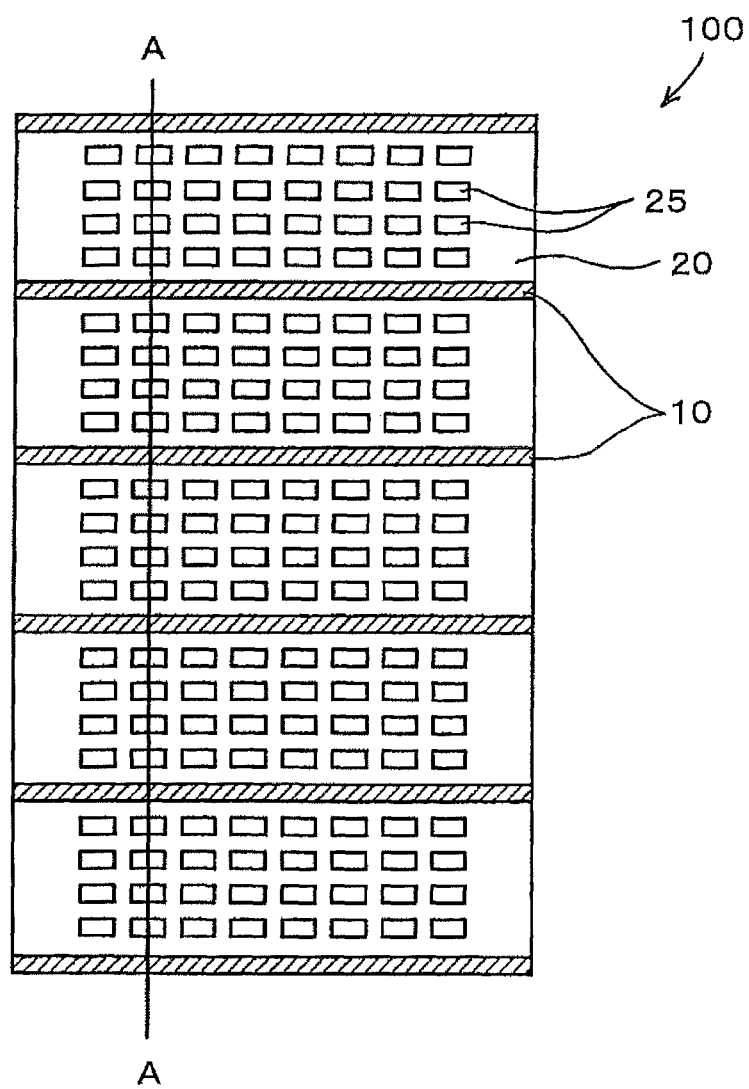
FIG. 1(a) is an elevation view exemplarily showing a vapor deposition mask according to an embodiment of the present disclosure as seen from the side on which a metal layer is formed in plan view.

Hereafter, embodiments of the present invention are described with reference to the drawings and the like. Notably, embodiments of the present invention can be implemented in many different modes and should not be construed to be limited to the contents of description of embodiments exemplified below. Moreover, while in the drawings, there are cases where widths, thicknesses, shapes of individual parts are schematically presented as compared with those in actual modes for more clarity of the description, they are merely exemplary, not limiting interpretation of an embodiment of the present invention. Moreover, in the specification of the present application and the drawings, elements similar to those described regarding already shown drawings are sometimes given the same signs to properly omit their detailed description. Moreover, while the description is made using terms such as "upward" or "downward" or the like for convenience of the description, the upward and downward directions may be reversed. The same holds true for the rightward and leftward directions.

<Vapor Deposition Mask>

Figure 1B:
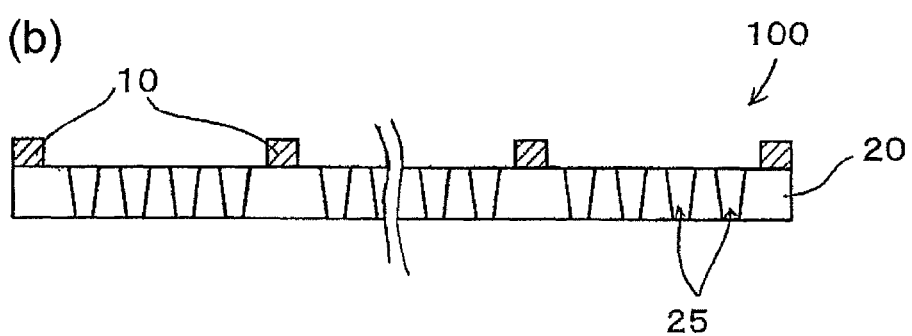
FIG. 1(b) is a schematic cross-sectional view in the A-A portion of FIG. 1(a).

FIG. 1(a) is an elevation view exemplarily showing a vapor deposition mask according to an embodiment of the present disclosure as seen from the side on which a metal layer is formed in plan view, and FIG. 1(b) is a schematic cross-sectional view in the A-A portion of FIG. 1(a). Notably, in FIG. 1(b), a part about the center of the vapor deposition mask is omitted.

As shown in FIGS. 1(a) and 1(b), a vapor deposition mask 100 according to an embodiment of the present disclosure includes: a resin mask 20 including resin mask openings 25 corresponding to a pattern to be produced by vapor deposition; and a metal layer 10 partially positioned on one surface of the resin mask 20, in FIG. 1(b), on the upper surface thereof.

According to the vapor deposition mask 100 as above, since most of the vapor deposition mask 100 is constituted of the resin mask 20, as compared with a conventional vapor deposition mask using a metal, its weight can be made lighter. Moreover, since in forming the resin mask 20, the resin mask openings 25 corresponding to the pattern to be produced by vapor deposition can be formed using laser or the like, the resin mask openings 25 are enabled to achieve higher definition. Furthermore, since the metal layer 10 is partially provided on one surface of such a resin mask 20, the resin mask 20 can be prevented from warping, and handling thereof can be made simple. Moreover, such a vapor deposition mask 100 is often used by being fixed to a metal-made frame, and providing the metal layer 10 facilitates its fixation since the metal layer 10 and the frame can be welded together in the fixation to the frame. Moreover, since the vapor deposition mask 100 can be positioned with the metal layer 10 being as a target, it can be simply fixed to the frame with excellent precision. Furthermore, according to the vapor deposition mask 100 as above, since providing the metal layer 10 can make resilience of the resin mask 20 strong, wrinkles can be suppressed from arising on the vapor deposition mask in its fixation to the frame. Notably, the fixation of the vapor deposition mask to the frame is typically performed in the state where stretching members (for example, clamps) are fixed to the end parts of the vapor deposition mask and the stretching members are pulled outward of the vapor deposition mask.

Hereafter, a configuration and the like of the vapor deposition mask 100 according to an embodiment of the present disclosure are specifically described.

(Resin Mask)

The resin mask 20 constituting the vapor deposition mask 100 according to an embodiment of the present disclosure is not specially limited but can be properly selected from conventionally known various resin masks 20 to be used.

The material of the resin mask 20 is not limited but any material can be used. For example, a material that enables formation of the resin mask openings 25 with high definition by laser processing or the like, includes a low rate of dimensional change and a low rate of humidity absorption under heat and with passage of time, and is light weight is preferably used. As such materials, a polyimide resin, a polyamide resin, a polyamide-imide resin, a polyester resin, a polyethylene resin, a polyvinyl alcohol resin, a polypropylene resin, a polycarbonate resin, a polystyrene resin, a polyacrylonitrile resin, an ethylene-vinyl acetate copolymer resin, an ethylene-vinyl alcohol copolymer resin, an ethylene-methacrylic acid copolymer resin, a polyvinyl chloride resin, a polyvinylidene chloride resin, cellophane, an ionomer resin and the like can be cited. Among the materials exemplarily cited above, resin materials with the thermal expansion coefficients of about 16 ppm/° C. or less are preferable, resin materials with the rates of humidity absorption of about 1.0% or less are preferable, and resin materials including both conditions are particularly preferable. The resin mask using these resin materials enables dimensional precision of the resin mask openings 25 to be improved and a rate of dimensional change and a rate of humidity absorption under heat and with passage of time to be small.

The thickness of the resin mask 20 is not specially limited but, in the case of further improving the effect of suppressing generation of a shadow, the thickness of the resin mask 20 is preferably not more than about 25 μm, still preferably less than about 10 μm. A preferable range of the lower limit value is not specially limited but, in the case where the thickness of the resin mask 20 is less than about 3 μm, defects such as a pinhole tend to arise and a risk of deformation or the like increases. In particular, by setting the thickness of the resin mask 20 to be not less than about 3 μm and less than about 10 μm, still preferably not less than about 4 μm and not more than about 8 μm, the influence of a shadow in formation of a high definition pattern exceeding 400 ppi can be more effectively prevented. Moreover, while the resin mask 20 may be directly bonded to the metal layer 10 mentioned later or may be bonded thereto via a pressure-sensitive adhesive agent layer, in the case where the resin mask 20 is bonded to the metal layer 10 via the pressure-sensitive adhesive agent layer, the total thickness of the resin mask 20 and the pressure-sensitive adhesive agent layer is preferably within the aforementioned preferable thickness range. Notably, the shadow is a phenomenon that a part of a vapor deposition material released from a vapor deposition source collides with inner wall surfaces of the opening of the resin mask and does not reach the vapor deposition target, and thereby, a portion without vapor deposition that has a film thickness smaller than the intended vapor deposition film thickness arises.

The sectional shape of the resin mask opening 25 is not specially limited but end surfaces that face each other and are of the resin mask forming the resin mask openings 25 may be substantially parallel to each other, but as shown in FIG. 1(b), the sectional shape of the resin mask opening 25 is preferably a shape including broadening toward a vapor deposition source. In other words, it preferably includes a slope (sometimes referred to as taper) including broadening toward the surface side on which the metal layer is formed. While a slope angle can be properly set with the thickness or the like of the resin mask 20 taken into consideration, an angle formed by a straight line connecting the lower bottom distal end in the resin mask opening 25 and the upper bottom distal end of the same resin mask opening and the bottom surface of the resin mask, in other words, an angle formed by an inner wall surface of the resin mask opening 25 and a surface of the resin mask 20 on the side that is not in contact with the metal layer 10 (lower surface of the resin mask in the mode shown in the figure) in the thicknesswise cross section of the inner wall surface constituting the resin mask opening 25 is preferably within a range not less than about 5° and not more than about 85°, still preferably within a range not less than about 15° and not more than about 75°, further preferably within a range not less than about 25° and not more than about 65°. In particular, within this range, it is preferably an angle smaller than a vapor deposition angle of a vapor deposition machine to be used. Moreover, in the mode shown in the figure, while an end surface that forms the resin mask opening 25 exhibits a linear shape, there is no limitation thereto but may be in a curved shape convex outward, in other words, a shape of the entirety of the resin mask opening 25 may be a bowl shape. Moreover, it may be reversed, in other words, may be in a curved shape convex inward.

Moreover, in an exemplary vapor deposition mask 100 according to an embodiment of the present disclosure, "one screen" constituted of an aggregate of a plurality of resin mask openings 25 is arranged for each of a plurality of screens at predetermined intervals in the resin mask 20 constituting the vapor deposition mask. Notably, "Resin mask openings 25" here mean the pattern(s) to be produced using the vapor deposition mask 100 according to an embodiment of the present disclosure. For example, when the vapor deposition mask is used for forming an organic layer in an organic EL display, the shape of the resin mask openings 25 is the shape of the organic layer. Moreover, "one screen" is constituted of an aggregate of the resin mask openings 25 corresponding to one product, and when the one product is an organic EL display, an aggregate of organic layers needed for forming the one organic EL display, in other words, an aggregate of resin mask openings 25 to be the organic layers is "one screen".

(Metal Layer)

As shown in FIG. 1, in the vapor deposition mask 100 according to an embodiment of the present disclosure, the metal layer 10 is partially provided on one surface of the resin mask 20.

The material of the metal layer 10 constituting the vapor deposition mask 100 according to an embodiment of the present disclosure is not specially limited but, for example, metal materials such as stainless steel, iron-nickel alloy and aluminum alloy can be cited. Moreover, a metal material other than these may be used. Above all, an invar material which is iron-nickel alloy can be preferably used since an invar material is hardly deformed by heat.

While the thickness of the metal layer 10 is not specially limited but, in order to more effectively prevent generation of a shadow, is preferably not more than about 100 μm, still preferably not more than about 50 μm, particularly preferably not more than about 35 μm. Notably, in the case of being thinner than about 5 μm, risks of rupture and deformation tend to increase and handling tends to be difficult.

Notably, in the case where a plurality of metal layers 10 are arranged on the resin mask 20, all the metal layers 10 are not needed to include the same material or the same thickness but they may include different materials and thicknesses depending on places where the metal layers 10 are arranged.

Moreover, the sectional shape of the metal layer 10 is not specially limited but, as shown in FIG. 1(b), the end surfaces, of the metal layer 10, that face each other may be substantially parallel to each other, and not shown, it may include a shape including a slope similarly to the resin mask opening 25.

Herein, the position where the metal layer 10 is provided and the shape of the metal layer in plan view are not specially limited. Namely, the planar shape of the metal layer can be properly designed depending on the position where the metal layer is provided.

Figure 14:
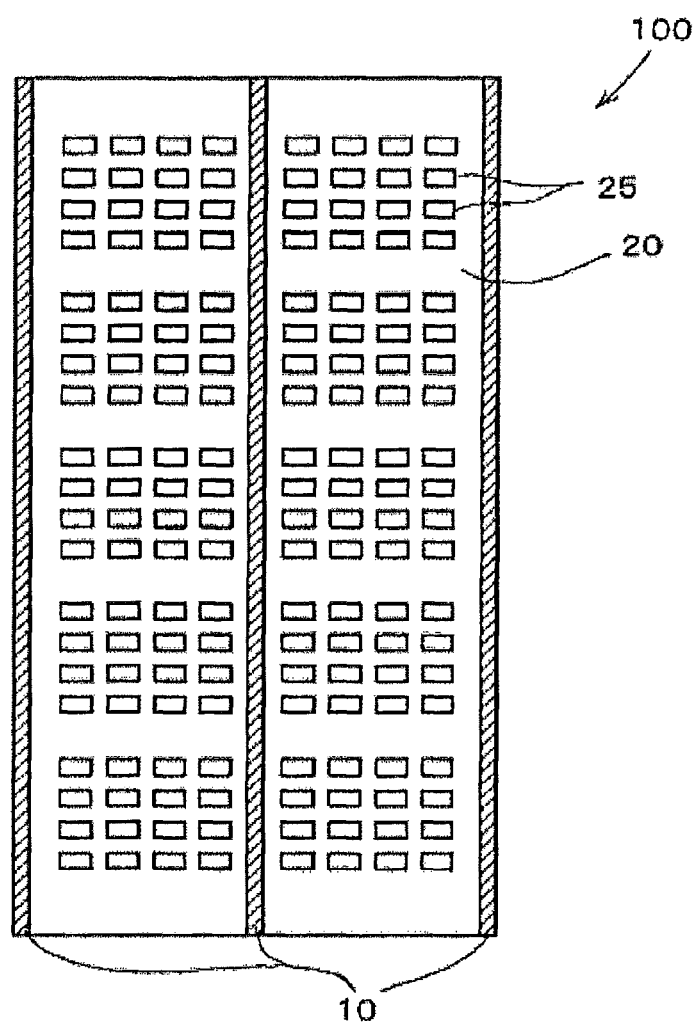
FIG. 14 is an elevation view exemplarily showing a vapor deposition mask according to another embodiment of the present disclosure as seen from the side on which a metal layer is formed in plan view.

For example, as shown in FIG. 1(*a*), when the resin mask 20 exhibits a quadrangular shape including a long side and a short side, for example, a rectangular shape as the resin mask 20 constituting the vapor deposition mask 100 is seen in plan view, the metal layer may be set to include a band shape along the long side of the resin mask. For example, while the shape of the metal layer 10 may be set to be a band shape with the same length as that of the short side, it may be arranged to be parallel to the short side of the resin mask 20. On the other hand, as shown in FIG. 14, when the resin mask 20 exhibits a rectangular shape including long sides and short sides as the resin mask 20 constituting the vapor deposition mask 100 is seen in plan view, while the shape of the metal layer 10 may be set to be a band shape with the same length as that of the long side, it may be arranged to be parallel to the long side of the resin mask 20. Moreover, the shape of the metal layer may be set to be a band shape with a predetermined angle relative to the long side of the resin mask. Notably, the quadrangle is not limited to a rectangle but may be, for example, a trapezoid or a parallelogram. It may be a quadrangle other than these. Moreover, the shape of the resin mask 20 to be made planar may be a shape other than quadrangular shapes. Moreover, also in the case of the resin mask 20 which is set to include a shape other than quadrangular shapes as the resin mask 20 is made planar, the shape of the metal layer 10 and the mode of arrangement thereof described in the specification of the present application can be properly applied.

While in the mode shown in FIG. 1, six band-shaped metal layers 10 are arranged to be parallel to the short sides of the resin mask 20 and in the mode shown in FIG. 14, three band-shaped metal layers 10 are arranged to be parallel to the long sides of the resin mask 20, the number of arranged metal layers 10 is not limited but, for example, not shown, a mode where only one metal layer 10 of the plurality of metal layers 10 is arranged may be set.

Figure 11:
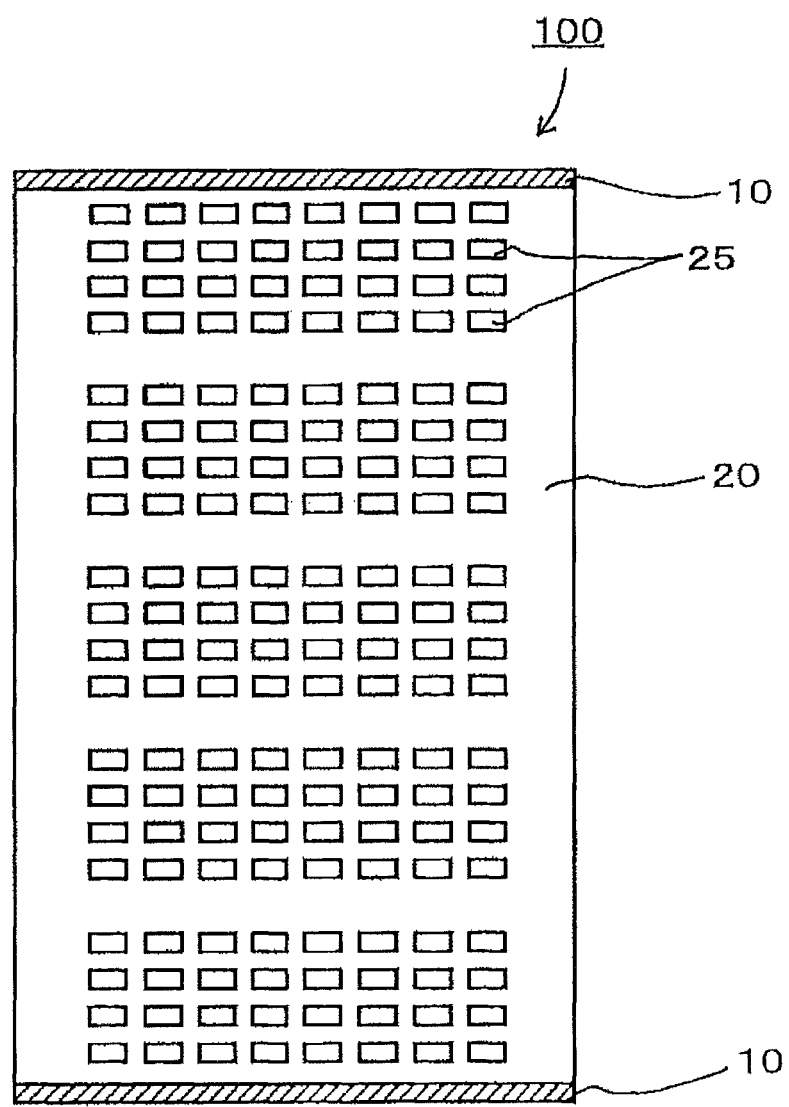
FIG. 11 is an elevation view exemplarily showing a vapor deposition mask according to another embodiment of the present disclosure as seen from the side on which a metal layer is formed in plan view.
Figure 15:
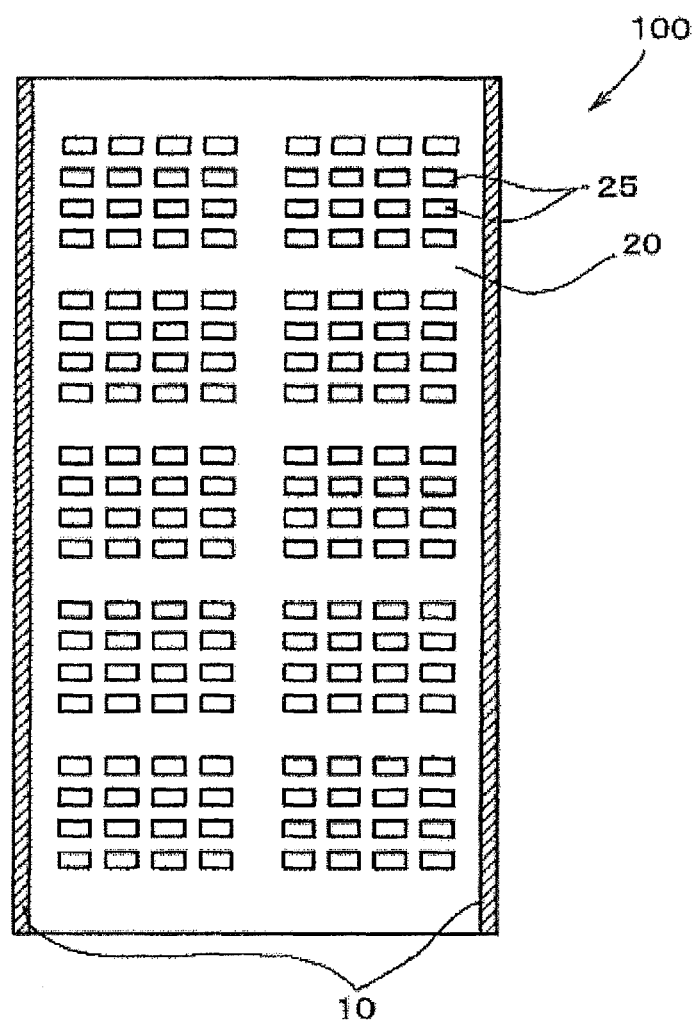
FIG. 15 is an elevation view exemplarily showing a vapor deposition mask according to another embodiment of the present disclosure as seen from the side on which a metal layer is formed in plan view.

Moreover, as shown in FIG. 11, band-shaped metal layers 10 with the same length as that of the short side may be arranged close to only the upper side and the lower side of the resin mask 20, and as shown in FIG. 15, metal layers 10 as band-shaped bodies with the same length as that of the long side may be arranged close to only the right side and the left side of the resin mask 20. Moreover, they may include band shapes including a smaller length than that of the long side. While in the vapor deposition mask 100 in the mode shown in FIG. 11 or FIG. 15, the metal layers 10 positioned close to the upper side and the lower side of the resin mask or close to the right side and the left side of the resin mask are arranged so as to be in contact with the peripheral edge of the resin mask 20, they are not needed to be in contact with the peripheral edge. Moreover, the metal layers 10 may be arranged only on the peripheral edge part of the resin mask 20. Notably, the peripheral edge part of the resin mask 20 stated in the specification of the present application means a region which, in fixing the vapor deposition mask to a frame, overlaps with a frame member constituting the frame in the thicknesswise direction. This region varies depending on the dimension of the frame, the width of the frame member constituting the frame, and the like. For example, in the mode shown in FIG. 1, a mode where the metal layers 10 are arranged only in the vicinities of any one or both sides of the upper side and the lower side of the resin mask out of the peripheral edge part of the resin mask 20 may be set. Moreover, in this case, the metal layers 10 may be arranged so as to be in contact with the peripheral edge of the resin mask. Moreover, in place of the band-shaped metal layers 10 with the same length as that of the long side or the short side of the resin mask 20, one or a plurality of metal layers with different lengths from that of the long side or the short side of the resin mask 20 may be arranged to be parallel to the long side or the short side of the resin mask 20. Moreover, one or a plurality of band-shaped metal layers 10 may be arranged in random directions.

Figure 16:
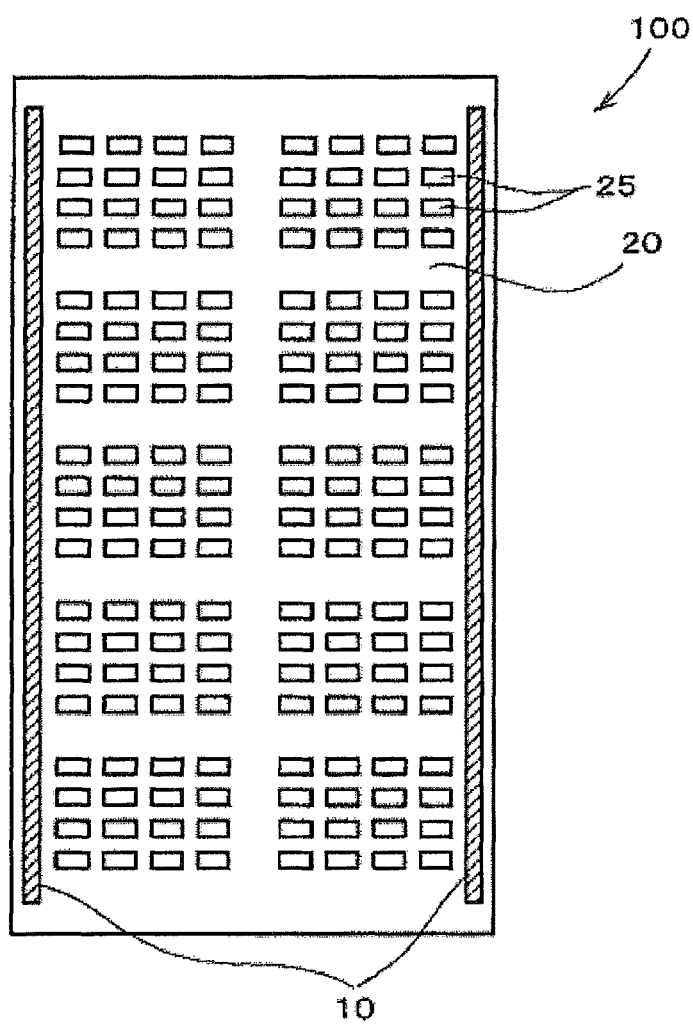
FIG. 16 is an elevation view exemplarily showing a vapor deposition mask according to another embodiment of the present disclosure as seen from the side on which a metal layer is formed in plan view.
Figure 17:
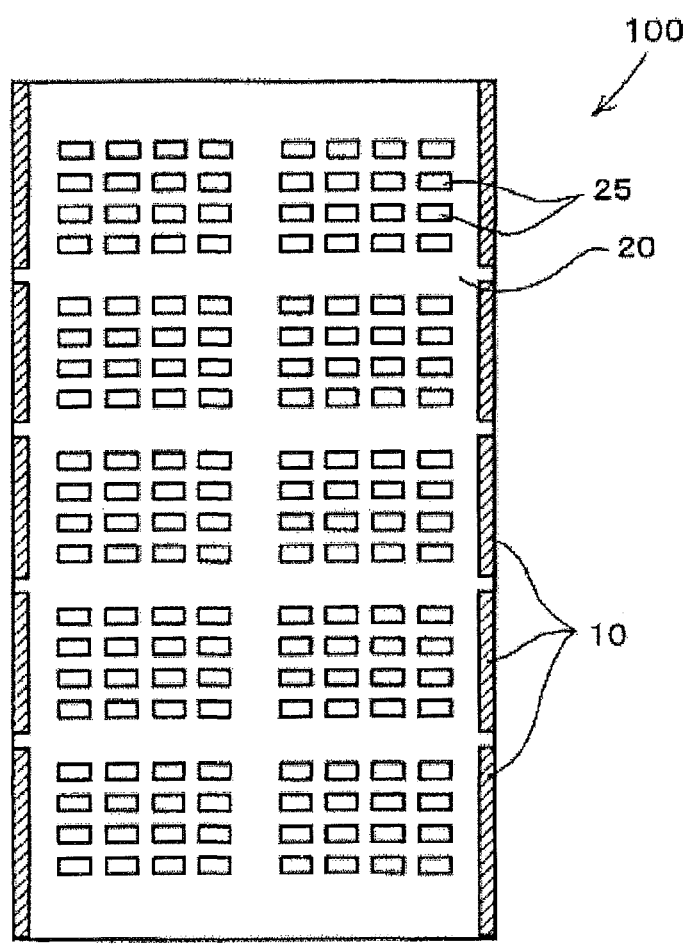
FIG. 17 is an elevation view exemplarily showing a vapor deposition mask according to another embodiment of the present disclosure as seen from the side on which a metal layer is formed in plan view.

For example, as shown in FIG. 16, metal layers 10 as band-shaped bodies with a smaller length than those of the right side and the left side, that is, the long sides of the resin mask 20 may be arranged at positions apart from the peripheral edges of the right side and the left side of the resin mask 20. The region where the metal layers 10 are arranged in FIG. 16 may be the peripheral edge part of the resin mask 20 or may be a non-peripheral edge part thereof. Moreover, it may be a region across the peripheral edge part and the non-peripheral edge part. Notably, the non-peripheral edge part of the resin mask 20 stated in the specification of the present application means a region different from the aforementioned peripheral edge part of the resin mask 20 as a whole. In other words, it means a region which, in fixing the vapor deposition mask to a frame, does not overlap with a frame member constituting the frame in the thicknesswise direction. Moreover, as shown in FIG. 17, each of the band-shaped metal layers 10 arranged to be parallel to the long side of the resin mask 20 may be divided into a plurality of pieces, in FIG. 17, into five pieces in the lengthwise direction.

As above, by arranging the band-shaped metal layer 10 to be parallel to the long side or the short side of the resin mask 20, deformation such as expansion and contraction of the resin mask 20 in the lengthwise direction of the band-shaped metal layer 10 can be effectively suppressed, and wrinkles can be suppressed from arising on the vapor deposition mask 100 in its fixation to a frame. Accordingly, when the resin mask 20 includes the long side and the short side, the metal layer 10 is preferably arranged to be parallel to the long side which causes a large amount of change such as expansion or contraction.

Figure 2:
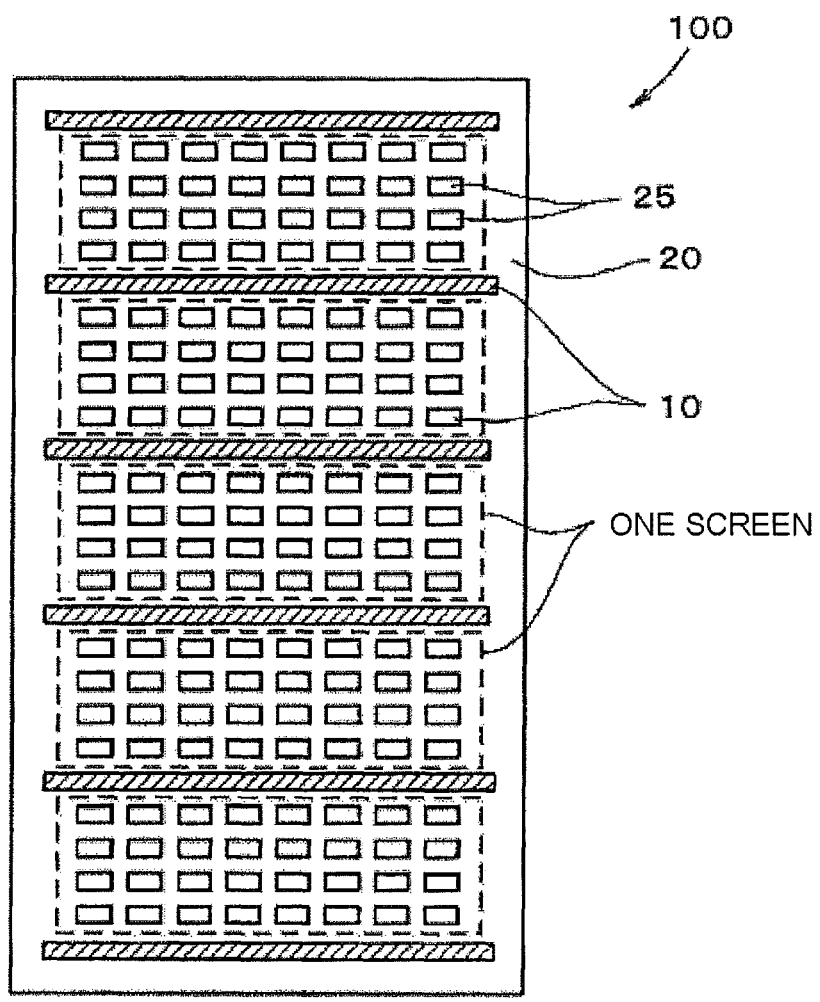
FIG. 2 is an elevation view exemplarily showing a vapor deposition mask according to another embodiment of the present disclosure as seen from the side on which a metal layer is formed in plan view.

FIG. 2 is an elevation view exemplarily showing a vapor deposition mask according to another embodiment of the present disclosure as seen from the side on which a metal layer is formed in plan view.

The metal layer 10 is not necessarily positioned on the peripheral edge part of the resin mask 20. FIG. 2 exemplarily shows the metal layers 10 positioned only on the non-peripheral edge part of the resin mask 20. Moreover, the metal layers 10 may be arranged on the peripheral edge part of the resin mask 20 and on the non-peripheral edge part thereof.

As above, by arranging the metal layers 10 also on the non-peripheral edge part of the resin mask 20, specifically, at positions, on the resin mask 20, not overlapping with a frame, not only the metal layer 10 is used for fixation to the frame but also it can effectively suppress deformation which can arise in the resin mask 20, such as expansion and contraction. Moreover, by setting the shape of the metal layer 10 to be a band shape, as compared with the case where the peripheries of the openings 25 formed in the resin mask 20 are enclosed by the metal layer, in fixing the vapor deposition mask to a frame, stress which can arise on the resin mask 20 can be properly released, and as a result, deformation such as expansion and contraction can also be effectively suppressed.

Notably, a dotted line shown in FIG. 2 indicates a region of "one screen". When the metal layer 10 is arranged on the non-peripheral edge part, the metal layer 10 may be arranged between "one screen" and "one screen".

Figure 3:
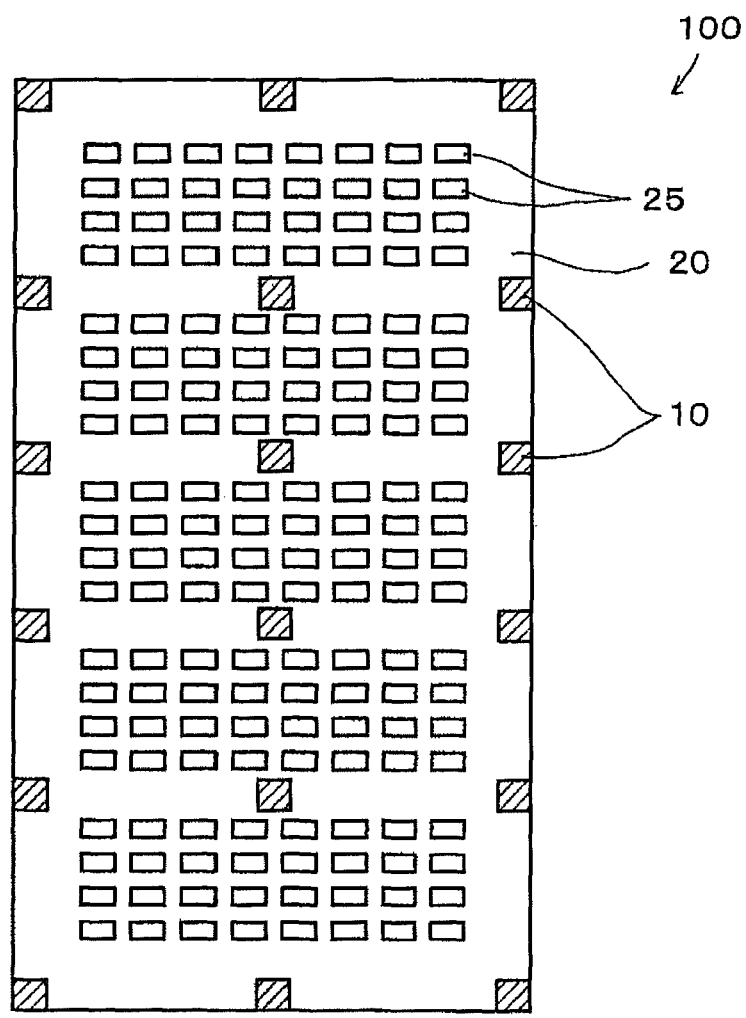
FIG. 3 is an elevation view exemplarily showing a vapor deposition mask according to another embodiment of the present disclosure as seen from the side on which a metal layer is formed in plan view.

FIG. 3 is an elevation view exemplarily showing a vapor deposition mask according to still another embodiment of the present disclosure as seen from the side on which a metal layer is formed in plan view.

Figure 18:
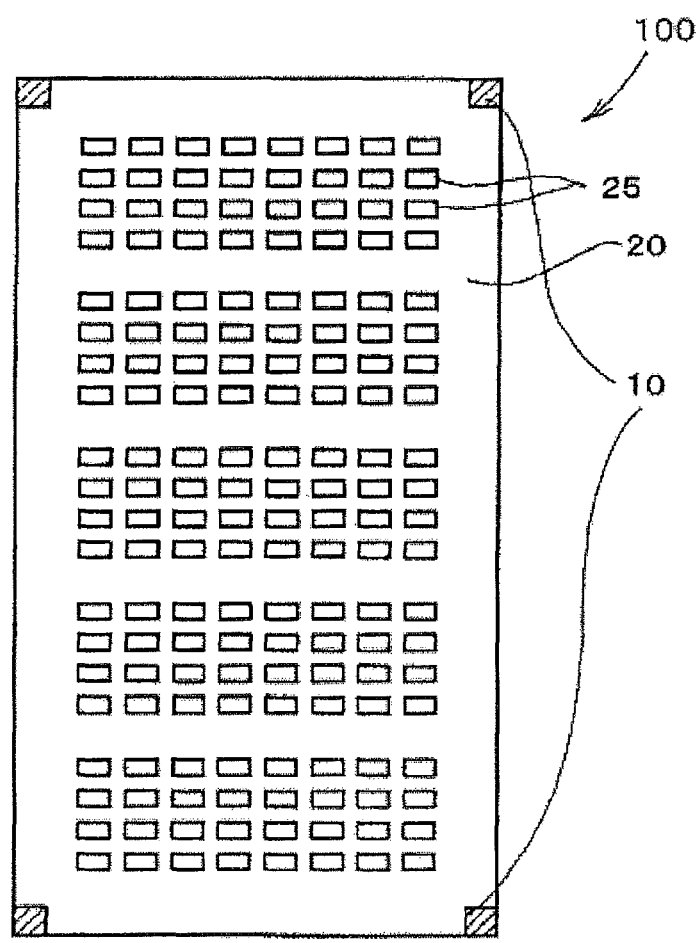
FIG. 18 is an elevation view exemplarily showing a vapor deposition mask according to another embodiment of the present disclosure as seen from the side on which a metal layer is formed in plan view.

As shown in FIG. 3, each of the metal layers 10 is not necessarily in a band shape, but they may be arranged so as to be scattered on the resin mask 20, or furthermore, as shown in FIG. 18, the metal layers 10 may be arranged only at the four corners of the resin mask 20. In such cases, while the metal layers 10 shown in FIG. 3 and FIG. 18 are square, the shapes are not limited to this, and any shapes can be employed, such as a rectangle, a triangle, polygons having four or more angles, a circle, an ellipse, a semicircle, a torus, a "C"-shape, a "T"-shape, a "cross" shape and a "star" shape. When a plurality of metal layers 10 are provided on one resin mask 20, all the metal layers 10 are not needed to be in the same shape but the metal layers 10 in various shapes stated above may be mixed thereon. Moreover, the shapes of the metal layers 10 and the modes of arrangement thereof described above may be properly combined. Even in such a case, similarly to the case where the aforementioned metal layer 10 is band-shaped, in fixing the vapor deposition mask to a frame, stress which can arise on the resin mask can be released.

Notably, the vapor deposition mask 100 according to an embodiment of the present disclosure is not needed to be constituted only of the resin mask 20 and the metal layers 10 as shown in FIGS. 1 to 3, FIG. 11 and FIGS. 14 to 18 but may include another configuration. For example, a protective sheet (which may be a protective film, a protective layer or a protective plate) may be disposed on a surface, of the resin mask 20, that is on the side where the metal layers 10 are not arranged. By arranging the protective sheet on the rear surface side of the resin mask 20, when the resin mask openings 25 are formed by laser processing, burrs and rubble can be suppressed from arising, and strength in the periphery of the resin mask openings 25 can be prevented from deteriorating in laser processing. In short, its synergistic effect with the metal layer 10 can effectively suppress deformation of the resin mask 20, such as expansion and contraction. Moreover, according to the vapor deposition mask 100 according to the present embodiment in which both the metal layer 10 and the protective sheet are provided, in forming the resin mask openings by laser processing, deformation of the resin mask 20 and occurrence of positional displacement can be reduced. Notably, a method for producing a vapor deposition mask using the protective sheet is mentioned later.

A method for producing the vapor deposition mask 100 as above is not specially limited. For example, by preparing a resin plate and forming a metal layer at a desired position on the resin plate, a metal layer-equipped resin plate, a so-called vapor deposition mask preparation body, is formed. A method for forming the metal layer in this case is not specially limited but the metal layer can be performed by various plating methods, an etching method, various printing methods, a vapor deposition method, and the like. Next, in the state of this metal layer-equipped resin plate or after this is fixed to a frame 60, by forming openings in desired shapes in the resin plate by laser processing or the like, the vapor deposition mask 100 can be obtained.

<An Example of Method for Producing Vapor Deposition Mask>

Figure 6A:
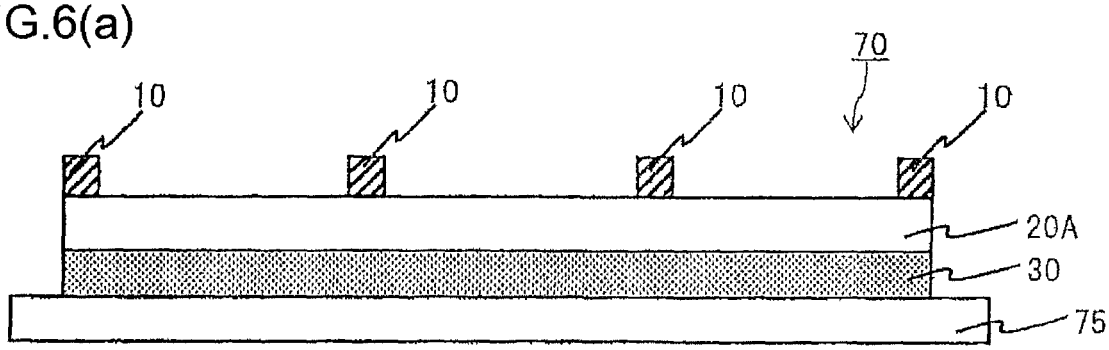
FIG. 6 is a step diagram showing examples of a method for producing a vapor deposition mask of an embodiment.
Figure 6B:
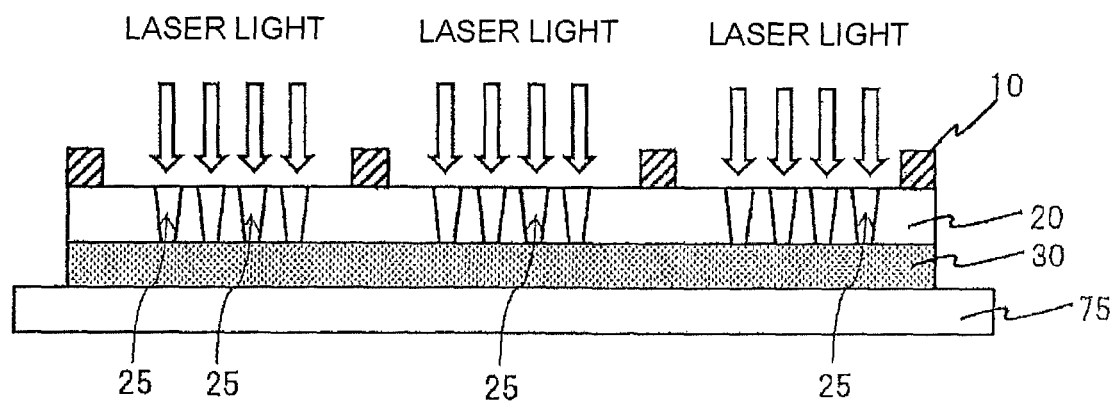
Figure 6C:
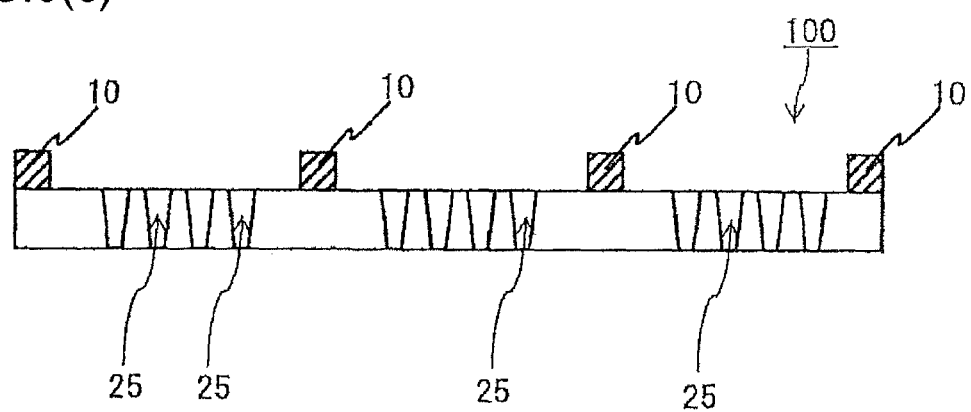

Hereafter, a method for producing a vapor deposition mask according to an embodiment of the present disclosure is described showing an example. An exemplary method for producing a vapor deposition mask is a method for producing a vapor deposition mask including: the resin mask 20 including the resin mask openings 25 corresponding to a pattern to be produced by vapor deposition; and the metal layer 10 partially positioned on one surface of the resin mask 20, the method including: as shown in FIG. 6(a), a step of preparing a vapor deposition mask preparation body 70 in which the metal layer 10 is partially positioned on one surface of a resin plate 20A for obtaining the resin mask 20 and a protective sheet 30 with peel strength not less than about 0.0004 N/10 mm and less than about 0.2 N/10 mm in conformity with JIS Z-0237:2009 is provided on the other surface of the resin plate 20A; as shown in FIG. 6(b), a step of irradiating, with respect to the vapor deposition mask preparation body 70, the resin plate 20A with laser light from the metal layer 10 side to form the resin mask openings 25 corresponding to the pattern to be produced by vapor deposition in the resin plate 20A; and as shown in FIG. 6(c), a step of peeling off the protective sheet 30 from the resin mask 20 in which the resin mask openings 25 corresponding to the pattern to be produced by vapor deposition are formed, in other words, a step of peeling off the protective sheet 30 from the vapor deposition mask 100 which is a final production target. FIG. 6 is a step diagram exemplarily showing a method for producing a vapor deposition mask according to an embodiment of the present disclosure.

The peel strength stated in the specification of the present application is a synonym of 180° peel adhesive force in conformity with JIS Z-0237:2009, and measurement of the peel strength can be performed in conformity with (Method 2): 180° Peel Adhesive Force with Respect to Back Surface in JIS Z-0237:2009. Specifically, using a test plate obtained by pasting a test tape (polyimide film (polyimide tape 5413, 3M Japan Limited) having a pressure-sensitive adhesive agent on its surface) on a stainless steel plate such that the stainless steel plate and the pressure-sensitive adhesive agent oppose each other, a protective sheet as a test piece is pasted on this polyimide film of the test plate, peel strength (relative to polyimide) in the occasion when the protective sheet as the test piece is peeled off at 180° from the polyimide film as the test plate is measured by the method in conformity with JIS Z-0237:2009, and thereby, the peel strength of the protective sheet can be measured. As a measurement machine which performs measurement of the peel strength, an electromechanical universal testing instrument (5900 series, Instron Japan Company Limited) is to be used.

According to a method for producing a vapor deposition mask using the vapor deposition mask preparation body 70, when the resin plate 20A of the vapor deposition mask preparation body 70 is irradiated with laser light to decompose the resin plate 20A and to form the resin mask openings 25, "burrs" and "rubble" can be suppressed from arising. Thereby, the vapor deposition mask 100 which can form a vapor deposition pattern with high definition can be obtained. Specifically, the protective sheet 30 provided on the other surface of the resin plate 20A enables out-of-focus blur in the occasion when the resin plate 20A is irradiated with laser light to form the resin mask openings 25 to be suppressed, and "burrs" and "rubble" caused by insufficient decomposition of the resin plate 20A due to out-of-focus blur can be suppressed from arising. Moreover, according to the vapor deposition mask preparation body 70, for example, even in the case where a gap arises between the processing stage 75 and the vapor deposition mask preparation body 70 when the vapor deposition mask preparation body 70 is placed on the processing stage 75 to form the resin mask openings 25, out-of-focus blur in the occasion when the resin plate 20A is irradiated with laser light to form the resin mask openings 25 can be suppressed.

Moreover, according to the method for producing a vapor deposition mask according to an embodiment of the present disclosure, in addition to suppression of out-of-focus blur in the occasion when the resin mask openings 25 are formed in the resin plate 20A, the strength of the resin plate 20A itself can be enhanced, and also thereby, "burrs" and "rubble" can be suppressed from arising. Specifically, with the presence of the protective sheet 30 provided on the other surface of the resin plate 20A, the strength of the recess parts to be the resin mask openings 25 in the final stage and the resin plate 20A near the recess parts can be prevented from deteriorating. Specifically, when it is assumed that the protective sheet 30 is a resin plate, an apparent thickness of the resin plate 20A can be increased. In other words, the protective sheet 30 serves to prevent out-of-focus blur, and in addition, serves as a support body for preventing the strength of the resin plate from deteriorating. Notably, by preventing the strength of the recess parts to be the resin mask openings 25 in the final stage and the resin plate 20A near the recess parts from deteriorating with the protective sheet 30 provided on the other surface of the resin plate 20A, in the stage of forming the resin mask openings in the resin plate 20A by irradiation with laser light, parts of the resin plate 20A can be suppressed from being chipped off or undergoing similar action.

In other words, according to the method for producing a vapor deposition mask according to an embodiment of the present disclosure, "burrs" and "rubble" can be suppressed from arising in the occasion when the resin mask openings 25 are formed in the resin plate 20A, and the resin mask openings 25 can be formed in the resin plate 20A with excellent precision.

Furthermore, according to the method for producing a vapor deposition mask according to an embodiment of the present disclosure, in the step of peeling off the protective sheet 30, the resin plate 20A (resin mask 20 in which the resin mask openings 25 are formed) can be suppressed from being damaged, and the protective sheet 30 can be suppressed from being unintentionally peeled off before the step of peeling off the protective sheet 30.

In the vapor deposition mask preparation body 70 in a preferable mode, a protective sheet with peel strength not less than about 0.0012 N/10 mm and not more than about 0.012 N/10 mm in conformity with JIS Z-0237:2009 is provided on the other surface of the resin plate 20A. In the vapor deposition mask preparation body 70 in a still preferable mode, a protective sheet with peel strength not less than about 0.002 N/10 mm and not more than about 0.04 N/10 mm in conformity with JIS Z-0237:2009 is provided on the other surface of the resin plate 20A. In the vapor deposition mask preparation body 70 in a particularly preferable mode, the protective sheet 30 with peel strength not less than about 0.002 N/10 mm and not more than about 0.02 N/10 mm in conformity with JIS Z-0237:2009 is provided on the other surface of the resin plate 20A.

While in the above, the case where the resin mask openings 25 are formed in the state where the vapor deposition mask preparation body 70 is placed on the processing stage 75 is exemplarily described, in the method for producing a vapor deposition mask according to an embodiment of the present disclosure, the resin mask openings 25 can also be formed by irradiating the resin plate 20A of the vapor deposition mask preparation body with laser light, in the state where the vapor deposition mask preparation body 70 is fixed to a frame 60 without the vapor deposition mask preparation body 70 placed on the processing stage 75, or by another method other than this.

FIGS. 7(a) to 7(d) are schematic cross-sectional views exemplarily showing a method for producing the vapor deposition mask preparation body 70 used for the production of the vapor deposition mask according to an embodiment of the present disclosure, and in a mode shown in the figure, after the metal layer 10 is partially positioned on the resin plate 20A, the protective sheet 30 is provided on the surface of the resin plate 20A on the side that is not in contact with the metal layer 10. Notably, an arbitrary layer can also be provided between the resin plate 20A and the protective sheet 30 such that peel strength in conformity with JIS Z-0237:2009 in the occasion when the protective sheet 30 is peeled off from the resin plate 20A is not less than about 0.0004 N/10 mm and less than about 0.2 N/10 mm.

Figure 7A:
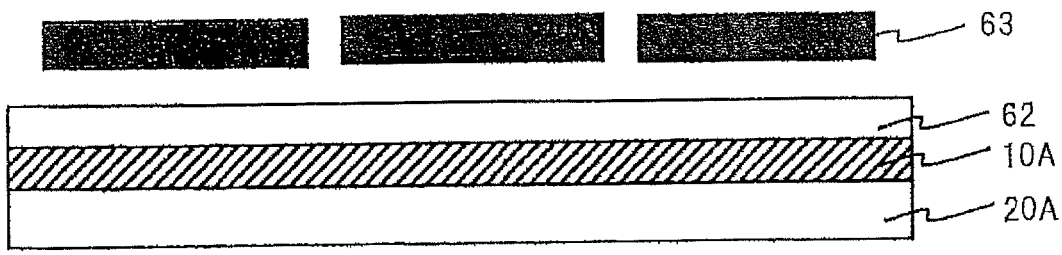
FIG. 7 is a step diagram showing examples of a method of producing a vapor deposition mask preparation body.
Figure 7B:
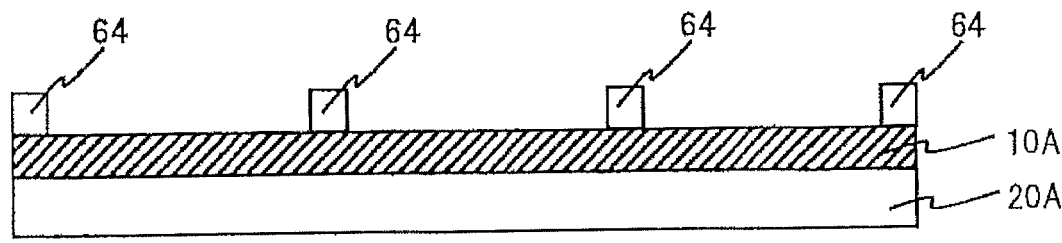
Figure 7C:
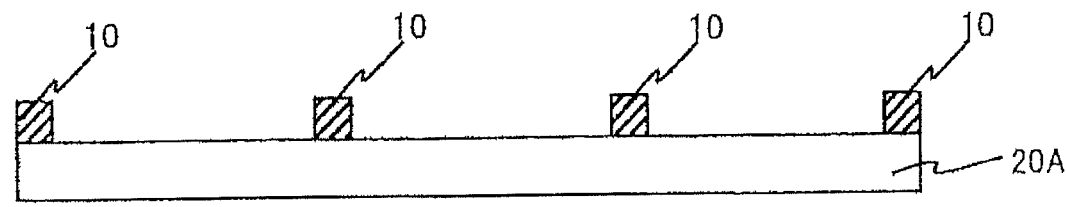
Figure 7D:
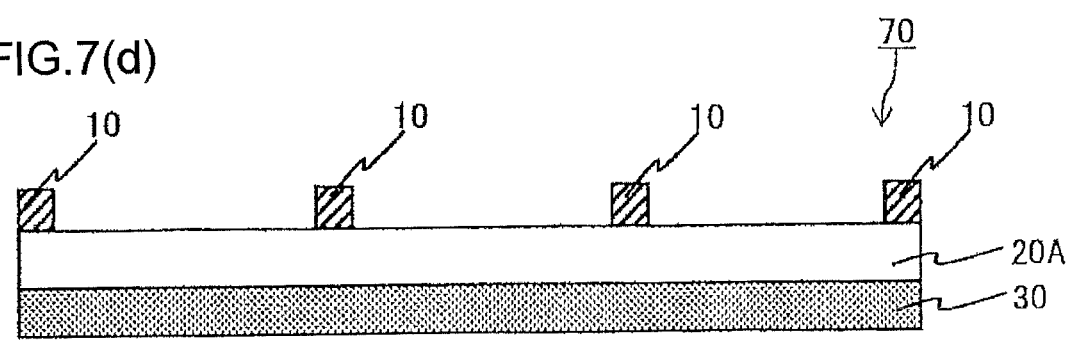

In an exemplary method for producing the vapor deposition mask preparation body, as shown in FIG. 7(a), a stacked body of the resin plate 20A and a metal plate 10A is prepared. For the stacked body of the resin plate 20A and the metal plate 10A, a method of applying and drying of coating liquid obtained by dispersing or dissolving a resin which is a material of the resin plate 20A in an appropriate solvent by a conventionally known coating method onto the metal plate 10A to form the resin plate 20A (also referred to as resin layer 20A), and the like can be cited. Moreover, the resin plate 20A may be pasted on the metal plate 10A via an adhesive layer or the like (which may be a resin film or a resin sheet). In the method, as shown in FIG. 7(a), after the metal plate 10A is provided on the resin plate 20A, the surface of the metal plate 10A is coated with a resist material 62, and the resist material is masked using a mask 63 for obtaining the metal layer 10, and is exposed and developed. Thereby, as shown in FIG. 7(b), a resist pattern 64 is formed on the surface of the metal plate 10A. Then, using the resist pattern 64 as an etching resistant mask, etching processing is performed only on the metal plate 10A, and the resist pattern is cleaned and removed after the etching. Thereby, as shown in FIG. 7(c), a stacked body in which the metal layer 10 is partially provided on one surface of the resin plate 20A is obtained. Next, as shown in FIG. 7(d), the protective sheet 30 is pasted on the other surface of the resin plate 20A of the obtained stacked body, or a layer which is to be the protective sheet 30 is formed thereon using various printing methods, and thereby, the vapor deposition mask preparation body 70 is obtained.

A masking method of the resist material is not specially limited but, as shown in FIG. 7(a), only the surface side, of the metal plate 10A, that is not in contact with the resin plate 20A may be coated with the resist material 62, or the individual surfaces of the resin plate 20A and the metal plate 10A may be coated (not shown) with the resist material 62. Moreover, a dry film method of pasting dry film resist on the surface, of the metal plate 10A, that is not in contact with the resin plate 20A, or on the individual surfaces of the resin plate 20A and the metal plate 10A can also be used. A coating method of the resist material 62 is not specially limited but, in the case where only the surface side, of the metal plate 10A, that is not in contact with the resin plate 20A is coated with the resist material 62, a spin coating method or a spray coating method can be used. Meanwhile, when the resin plate 20A and the metal plate 10A are stacked into a long sheet, a dip coating method or the like which can perform coating with a resist material in a roll-to-roll scheme is preferably used. Notably, in the dip coating method, the individual surfaces of the resin plate 20A and the metal plate 10A are to be coated with the resist material 62.

The resist material used is preferably excellent in processablity with desired resolution. Moreover, an etching agent used in the etching processing is not specially limited but a known etching agent only has to be properly selected.

An etching method of the metal plate 10A is not specially limited but, for example, wet etching methods such as a spray etching method of spraying an etching agent from an injection nozzle at predetermined injection pressure, a dip etching method in an etching solution filled with an etching agent, and a spin etching method of dropping an etching agent, and dry etching methods using gas, plasma and the like can be used.

The protective sheet 30 (i) may be directly provided on the other surface of the resin plate 20A, or (ii) may be indirectly provided on the other surface of the resin plate 20A via an arbitrary layer that peel strength in conformity with JIS Z-0237:2009 in the occasion when the protective sheet 30 is peeled off from the resin plate 20A is not less than about 0.0004 N/10 mm and less than about 0.2 N/10 mm.

As the protective sheet 30 directly provided on the other surface of the resin plate 20A, the protective sheet 30 whose surface includes self-adsorption or self-adhesion can be cited.

The self-adsorption of the protective sheet 30 stated here means a property with which, by a mechanism of the protective sheet 30 itself, it can be adsorbed on the other surface of the resin plate 20A, and specifically, means a property with which it can be brought into close contact onto the other surface of the resin plate 20A, not via an adhesive agent, a pressure-sensitive adhesive agent or the like between the other surface of the resin plate 20A and the protective sheet, and without need for an external mechanism such, for example, as attraction with a magnet or the like between the resin plate 20A and the protective sheet. According to such a protective sheet 30 with self-adsorption, in the occasion when it comes into contact with the resin plate 20A, the protective sheet 30 can be adsorbed onto the resin plate 20A while causing air to escape.

As the protective sheet 30 with self-adsorption, for example, the protective sheet 30 on which self-adsorption is expressed due to action of a resin material itself constituting the protective sheet 30 can be used.

Such a resin material of the protective sheet 30 is not specially limited but a material having a peel strength in conformity with JIS Z-0237:2009, in peeling-off from the resin plate 20A, of not less than about 0.0004 N/10 mm and less than about 0.2 N/10 mm can be properly selected and used. Examples of the protective sheet 30 include, as a resin which can express self-adsorption, an acrylic resin, a silicone-based resin, a urethane-based resin, a polyester resin, an epoxy resin, a polyvinyl alcohol resin, a cycloolefin resin, a polyethylene resin and the like, and therewith, peel strength, in conformity with JIS Z-0237:2009, in the occasion when the protective sheet 30 is peeled off from the resin plate 20A, of not less than about 0.0004 N/10 mm and less than about 0.2 N/10 mm. Also for a resin material of the protective sheet including a cell suction cup structure mentioned later, these resin materials can be used. Notably, the protective sheet 30 may solely contain one type of resin, or may contain two or more types of resins. For example, peel strength of the protective sheet 30 can also be adjusted so as to be the aforementioned peel strength using a combination of resin materials with high peelability. The same holds true for the protective sheets 30 in various modes mentioned later. Moreover, as the protective sheet 30 in which the resin material itself includes adsorption, for example, a sheet-like object and the like in which a material itself includes adsorption, which is disclosed in Japanese Patent Laid-Open No. 2008-36895, can also be used.

Moreover, in place of the aforementioned protective sheet 30 with self-adsorption due to action of the resin material itself, the protective sheet 30 whose surface includes a cell suction cup structure may be used. Also in the case of using the protective sheet 30 including the cell suction cup structure, it is sufficient that the peel strength in the occasion when the protective sheet 30 is peeled off from the resin plate 20A is the aforementioned peel strength. The cell suction cup structure means a continuous fine roughness structure formed on the surface, and self-adsorption is given the protective sheet 30 by this continuous fine roughness structure acting as suction cups. As such a protective sheet 30, for example, a sheet-like object and the like including the cell suction cup structure can be cited, which is disclosed in Japanese Patent Laid-Open No. 2008-36895.

By performing adhesion processing on the surface of the protective sheet 30 on the side that is contact with the resin plate 20A, pressure-sensitive adhesion (sometimes also referred to as adhesion) can also be expressed on the protective sheet 30. As the adhesion processing, for example, corona discharge processing, firing processing, ozone processing, ultraviolet light processing, radiation processing, roughness processing, chemical processing, plasma processing, low temperature plasma processing, primer processing, grafting processing and the like can be cited.

In place of the protective sheet 30 directly provided on the other surface of the resin plate 20A, the protective sheet 30 may be indirectly provided on the other surface of the resin plate 20A via a layer including adhesion or pressure-sensitive adhesion (hereinafter sometimes referred to as intermediate layer). Notably, also in modes in which the protective sheet 30 is indirectly provided, it is sufficient that the peel strength, in conformity with JIS Z-0237:2009, in the occasion when the protective sheet 30 is peeled off from the side of the resin plate 20A, is not less than about 0.0004 N/10 mm and less than about 0.2 N/10 mm.

When the protective sheet 30 itself does not include self-adsorption or self-adhesion, the intermediate layer serves to bring the resin plate 20A and the protective sheet 30 into close contact with each other. In other words, as the intermediate layer, a layer including adhesion or pressure-sensitive adhesion is used. Moreover, in the case where the protective sheet 30 is directly provided on the other surface of the resin plate 20A, when the condition that the peel strength in conformity with JIS Z-0237:2009 is not less than about 0.0004 N/10 mm and less than about 0.2 N/10 mm cannot be satisfied, the intermediate layer can also be provided between the resin plate 20A and the protective sheet 30, as a layer for adjusting peel strength in the occasion when the protective sheet 30 is peeled off from the resin plate 20A. Notably, as to the intermediate layer for adjusting peel strength, for example, in the case where peel strength in the occasion when the protective sheet 30 is peeled off is not less than about 0.2 N/10 mm when the protective sheet 30 is directly provided on the other surface of the resin plate 20A, it may be provided, as a layer for lowering this peel strength, between the resin plate 20A and the protective sheet 30, and in the case where peel strength in the occasion when the protective sheet 30 is peeled off is less than about 0.0004 N/10 mm, it may be provided, as a layer for increasing this peel strength, between the resin plate 20A and the protective sheet 30.

The intermediate layer may exhibit a single layer configuration constituted of one layer, or may exhibit a stacking configuration having two or more layers stacked. For example, an intermediate layer obtained by stacking an adhesive layer for bringing the resin plate 20A and the protective sheet 30 into close contact with each other, and a peel-off layer for adjusting peel strength in the occasion when the protective sheet is peeled off in this order from the resin plate 20A side may be provided between the resin plate 20A and the protective sheet 30.

The intermediate layer may be a layer which is peeled off from the resin plate 20A along with the protective sheet 30 when the protective sheet 30 is peeled off from the resin plate 20A, or may be a layer which remains on the resin plate 20A side. Notably, in the step of forming the resin mask openings 25 by irradiating the resin plate 20A with laser light, when the protective sheet 30 and the intermediate layer are decomposed with the laser light, since these can become new generation sources of "burrs" and "rubble", the protective sheet 30 and the intermediate layer are preferably not decomposed or hardly decomposed with laser light as mentioned later. Notably, when an intermediate layer that is not decomposed or hardly decomposed with laser light is set, and a configuration in which the intermediate layer remains on the resin plate 20A side in the step of peeling off the protective sheet 30 from the resin plate 20A is set, the remaining intermediate layer is to close the resin mask openings 25 formed in the resin plate 20A, which is not preferable. With this point taken into consideration, the material of the intermediate layer is preferably not decomposed or hardly decomposed with laser light, can preferably be within a range of the aforementioned peel strength in the occasion when the protective sheet 30 is peeled off from the resin plate 20A, and can preferably make its close contact with the protective sheet 30 higher than its close contact with the resin plate 20A. According to such a mode, the protective sheet 30 can be peeled off from the resin plate 20A along with the intermediate layer.

As the protective sheet 30 indirectly provided on the other surface of the resin plate 20A, for example, various plastic films or sheets of polyester such as poly(ethylene telephthalate), polyarylate, polycarbonate, polyurethane, polyimide, polyether imide, cellulose derivatives, polyethylene, ethylene-vinyl acetate copolymers, polypropylene, polystyrene, acrylics, polyvinyl chloride, polyvinylidene chloride, polyvinyl alcohol, polyvinyl butyral, nylon, polyetheretherketone, polysulfone, polyethersulfon, tetrafluoroethylene-perfluoroalkyl vinyl ether, polyvinylfluoride, tetrafluoroethylene-ethylene, tetrafluoroethylene-hexafluoropropylene, polychlorofluoroethylene, polyvinylidene fluoride and the like can be cited.

As the material of the intermediate layer, for example, an acrylic resin, a vinyl chloride-based resin, a vinyl acetate-based resin, a vinyl chloride/vinyl acetate copolymer resin, a polyester-based resin, a polyamide-based resin and the like can be cited.

The thickness of the intermediate layer is not specially limited but is preferably within a range not less than about 1 µm and not more than about 50 µm, still preferably within a range not less than about 3 µm and not more than about 20 µm.

A method of forming the intermediate layer is not specially limited but, for example, it can be formed by coating and drying, on the other surface of the resin plate 20A, of a coating liquid for an intermediate layer which liquid is obtained by dissolving or dispersing, in an appropriate solvent, one or two or more resin materials with which peel strength in the occasion when the protective sheet 30 is peeled off from the resin plate 20A can be within a range of the aforementioned peel strength, and in addition, an additive which is added as needed. Moreover, in place of the method of forming the intermediate layer by coating, pasting of a pressure-sensitive adhesive sheet or the like with which peel strength in the occasion when the protective sheet 30 is peeled off from the resin plate 20A can be within a range of the aforementioned peel strength can also form the intermediate layer.

The protective sheet 30 provided on the intermediate layer may be formed by pasting, on the intermediate layer, a protective sheet (protective film, protective plate can be used) having a peel strength, in conformity with JIS Z-0237: 2009, in the occasion when the protective sheet 30 is peeled off from the resin plate 20A, of not less than about 0.0004 N/10 mm and less than about 0.2 N/10 mm, or may be formed by coating and drying, on the other surface of the resin plate 20A, of coating liquid obtained by dissolving or dispersing, in an appropriate solvent, one or two or more resin materials with which peel strength in the occasion when the protective sheet 30 is peeled off from the resin plate 20A can satisfy the aforementioned condition, and in addition, an additive which is added as needed.

The protective sheet 30 in preferable modes includes about 70% or more of transmittance at a wavelength of laser light for forming the resin mask openings 25 in the resin plate 20A, preferably about 80% or more thereof, regardless of the protective sheet 30 directly provided on the resin plate 20A or indirectly provided thereon via an intermediate layer or the like. Moreover, when the protective sheet 30 is indirectly provided on the resin plate 20A via the intermediate layer, the intermediate layer as well as the protective sheet 30 preferably includes about 70% or more of transmittance at a wavelength of laser light for forming the resin mask openings 25 in the resin plate 20A, particularly about 80% or more thereof. According to the protective sheet 30 in preferable modes, in the occasion of irradiation with laser light to form the resin mask openings 25 in the resin plate 20A, the intermediate layer and the protective sheet 30 can be suppressed from being decomposed with this laser light. Thereby, various problems caused by decomposition of the intermediate layer and the protective sheet 30, for example, that "rubble" arising due to decomposition of the intermediate layer and the protective sheet 30 causes sticking or similar action onto the inner wall surfaces of the resin mask openings 25 formed in the resin plate 20A, can be suppressed. Notably, the wavelength of laser light is different depending on types of laser light used, and, for example, when a polyimide resin is used as the material of the resin plate 20A, YAG laser, excimer laser or the like is used. Notably, for fine processing, YAG laser (third harmonic generation) with 355 nm of wavelength of laser light, and excimer laser (KrF) with 248 nm of wavelength of laser light are suitable. Accordingly, when the protective sheet 30 is selected, the material of the protective sheet 30 only has to be properly selected such that the transmittance of laser light is the aforementioned preferable transmittance in accordance with a type of laser used. Moreover, as a method of setting the transmittance of the protective sheet 30 to the aforementioned preferable transmittance, measures of adjusting the thickness of the protective sheet 30, specifically, a method of making the thickness of the protective sheet 30 thin, and a method of using a resin material or the like high in transparency as the resin material of the protective sheet 30, can be cited.

The thickness of the protective sheet 30 is not specially limited but preferably not less than about 1 μm and not more than about 100 μm, still preferably not less than about 2 μm and not more than about 75 μm, further preferably not less than about 2 μm and not more than about 50 μm, particularly preferably within a range not less than about 3 μm and not more than about 30 μm. By setting the thickness of the protective sheet 30 to be not less than about 1 μm, strength of the protective sheet 30 can be sufficiently enhanced, and when the resin mask openings are formed by irradiating the resin plate 20A with laser light, risks or the like that the protective sheet 30 breaks or that the protective sheet 30 suffers cracks can be reduced. In particular, when the thickness of the protective sheet 30 is set to be not less than about 3 μm, these risks can be further reduced.

Moreover, as the protective sheet 30, a support member-integrated protective sheet (not shown) in which the protective sheet 30 is supported on a support member can also be used. With the support member-integrated protective sheet, even when the thickness of the protective sheet 30 itself is made thin, handling ability and the like of the protective sheet 30 can be made excellent. The thickness of the support member is not specially limited but can be properly set in accordance with the thickness of the protective sheet 30, preferably not less than about 3 μm and not more than about 200 μm, still preferably not less than about 3 μm and not more than about 150 μm, further preferably not less than about 3 μm and not more than about 100 μm, particularly preferably not less than about 10 μm and not more than about 75 μm.

The material of the support member is not specially limited but a resin material, a glass material and the like can be used, and the resin material is preferably used in view of flexibility and the like.

Figure 8A:
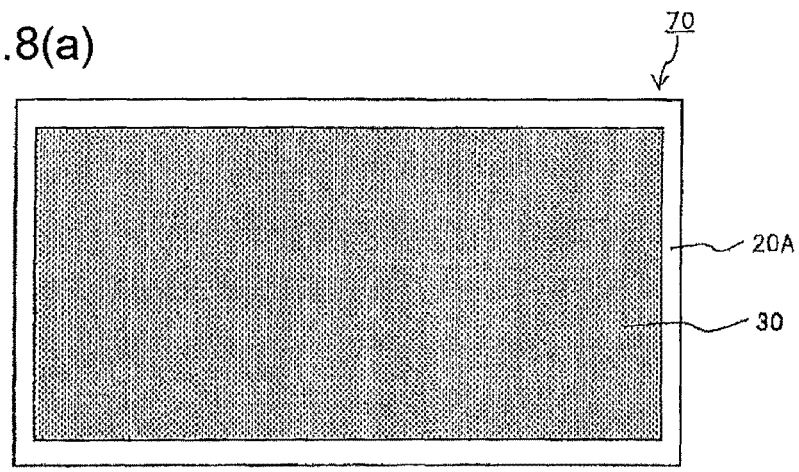
FIG. 8(a) is an elevation view of an exemplary vapor deposition mask preparation body as seen from the protective sheet side in plan view.
Figure 8B:
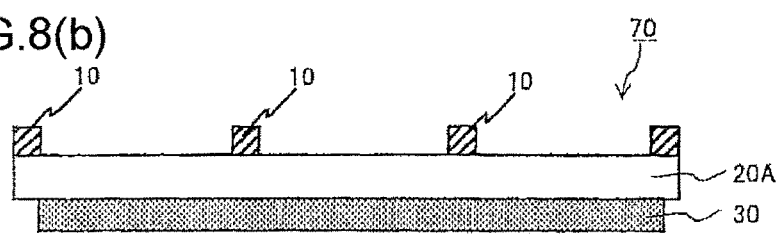
FIG. 8(b) is a schematic cross-sectional view of the vapor deposition mask preparation body in FIG. 8(a).

The protective sheet 30 is provided on the other surface of the resin plate 20A and at a position overlapping with the resin mask openings 25 formed in the resin plate 20A in the final stage in the thicknesswise direction. On the other surface of the resin plate 20A, one protective sheet 30 may be provided, or a plurality of protective sheets 30 may be provided. In a mode shown in FIGS. 8(*a*) and 8(*b*), one protective sheet 30 is provided on the other surface of the resin plate 20A. Notably, FIG. 8(*a*) is an elevation view of an exemplary vapor deposition mask preparation body 70 as seen from the protective sheet 30 side, and FIG. 5(*b*) is a schematic cross-sectional view thereof. While in the mode shown in FIG. 8, the length of the protective sheet 30 in the crosswise direction (horizontal direction in the figure) is made shorter than the length of the resin plate 20A in the crosswise direction, the length of the protective sheet 30 in the crosswise direction may be set to be the same length as the length of the resin plate 20A in the crosswise direction, and the end face of the protective sheet 30 may coincide with the end face of the resin plate 20A in planar position, or the length of the protective sheet 30 in the crosswise direction may be set to be longer than the length of the resin plate 20A in the crosswise direction, and the outer circumference of the protective sheet 30 may be caused to protrude from the resin plate 20A. The same holds true for the length of the protective sheet 30 in the lengthwise direction. Moreover, the same holds true for protective sheets 30 in various modes mentioned later.

Figure 9A:
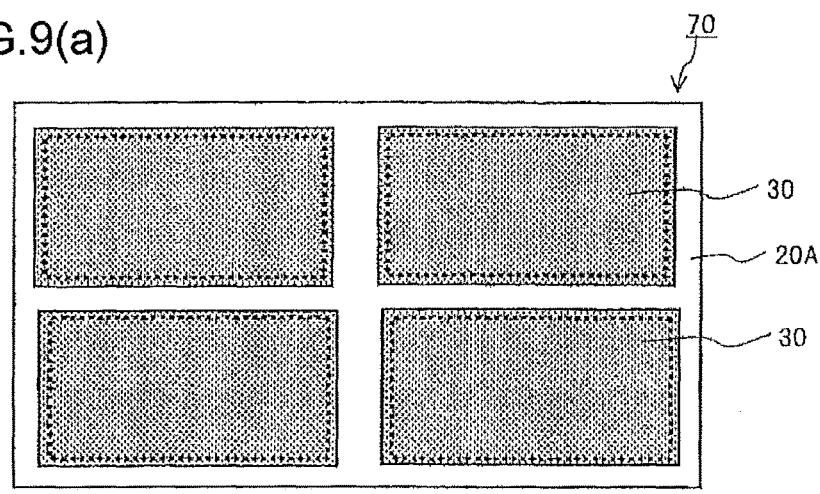
FIG. 9(a) is an elevation view of an exemplary vapor deposition mask preparation body as seen from the protective sheet side in plan view.
Figure 9B:
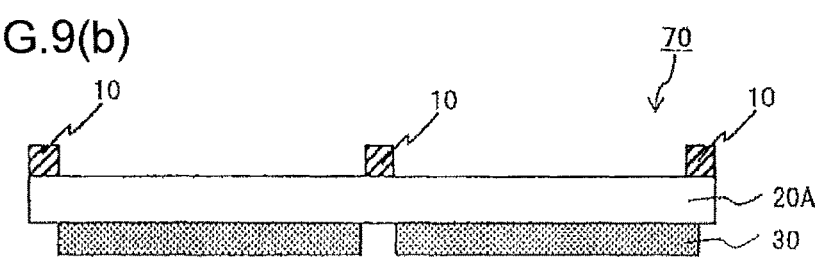
FIG. 9(b) is a schematic cross-sectional view of the vapor deposition mask preparation body in FIG. 9(a).

As shown in FIGS. 9(*a*) and 9(*b*), as to the protective sheet 30 in a preferable mode, a plurality of protective sheets 30 are provided on the other surface of the resin plate 20A. According to this mode, even when upsizing the resin plate 20A, in other words, even when upsizing the vapor deposition mask 100 produced in the final stage, the protective sheets 30 can be simply provided on the other surface of the resin plate 20A. In particular, when the protective sheet 30 is a protective sheet 30 with self-adsorption, as the dimension of the protective sheet 30 becomes larger, a risk that air remains between the resin plate 20A and the protective sheet 30 becomes larger, but by dividing the protective sheet 30 into a plurality of pieces to make the dimension thereof smaller, the risk that air or the like remains between the other surface of the resin plate 20A and each protective sheet 30 can be reduced, which can simply enhance close contact between the resin plate 20A and the protective sheet 30. Moreover, even when, due to a human error or the like in the occasion when the protective sheet 30 is pasted on the resin plate 20A, there arises a need to peel off the protective sheet 30 having been provided on the other surface of the resin plate 20A before the step of forming the resin mask openings 25 in the resin plate 20A, only the protective sheet 30 of interest is needed to be peeled off, which is preferable also in view of work efficiency.

The dimension or the like of the protective sheet 30 in the case where a plurality of protective sheets 30 are provided on the other surface of the resin plate 20A is not specially limited but, for example, it may be a dimension with which one or a plurality of resin mask openings 25 of resin mask openings formed in the final stage can be covered, or may be a dimension with which "one screen" of the aforementioned resin mask 20 or a plurality of screens can be covered. As to the protective sheet 30 in a preferable mode, each of the plurality of protective sheets 30 includes a dimension with which it overlaps with the "one screen" of the aforementioned resin mask 20 or the plurality of screens formed in the resin plate 20A in the final stage. In particular, since as to a vapor deposition mask in a preferable mode mentioned later, an interval between the screens is wider than an interval between the resin mask openings 25, in view of workability, the protective sheet 30 preferably includes a dimension with which it covers the "one screen" of the aforementioned resin mask 20 or the plurality of screens, and is preferably provided at a position overlapping with the "one screen" of the aforementioned resin mask 20 or the plurality of screens in the thicknesswise direction. Notably, in FIG. 9, each region enclosed by a dotted line is an arrangement scheduled region of the "one screen" of the aforementioned resin mask 20.

Figure 10A:
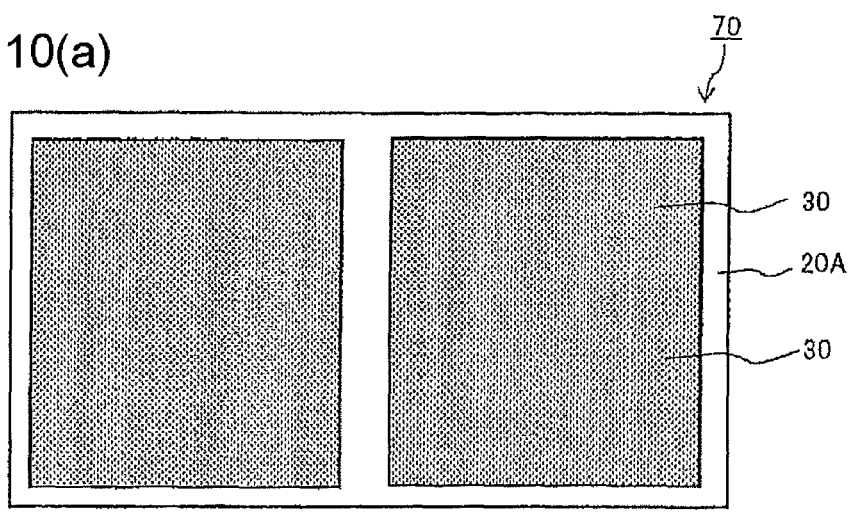
FIGS. 10(a) to 10(c) are elevation views of exemplary vapor deposition mask preparation bodies as seen from the protective sheet side in plan view.
Figure 10B:
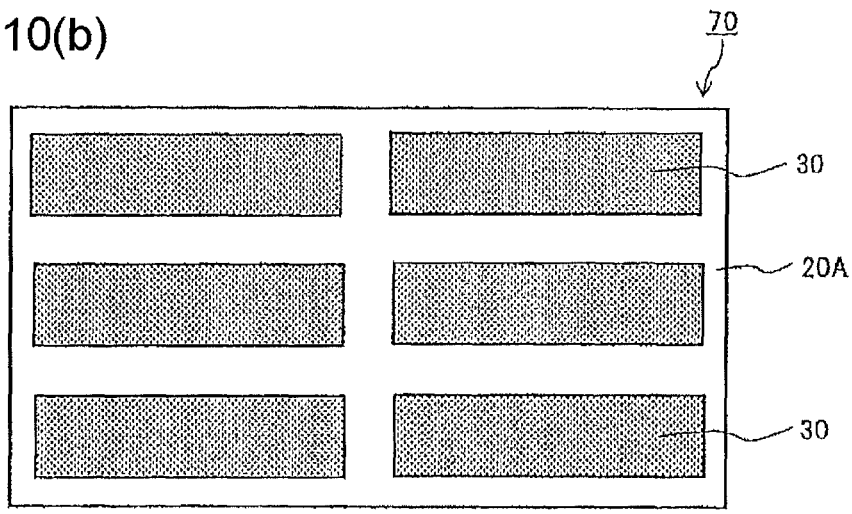
Figure 10C:
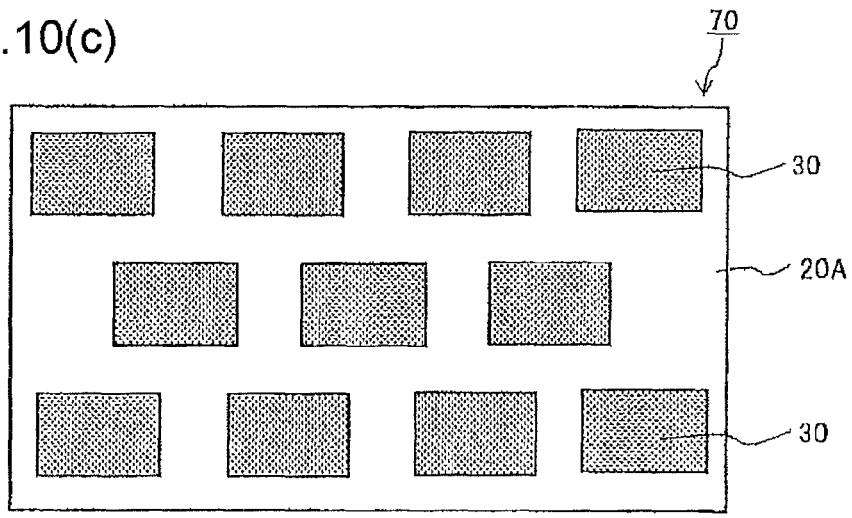

While in the mode shown in FIG. 9, the plurality of protective sheets 30 are regularly provided in the lengthwise direction and the crosswise direction of the vapor deposition mask preparation body (the vertical direction and the horizontal direction in the figure) as the vapor deposition mask preparation body 70 is seen from the protective sheet 30 side in plan view, as shown in FIG. 10(*a*), a plurality of protective sheets 30 extending in the lengthwise direction may be provided in the crosswise direction, or as shown in FIG. 10(*b*), a plurality of protective sheets 30 extending in the crosswise direction may be provided in the lengthwise direction. Moreover, as shown in FIG. 10(*c*), a plurality of protective sheets 30 may be alternately provided at random.

<Step of Forming Resin Mask Opening>

As shown in FIG. 6(*b*), this step is a step of irradiating, with respect to the vapor deposition mask preparation body 70 prepared above, the resin plate 20A with laser light from the metal layer 10 side to form the resin mask openings 25 corresponding to a pattern to be produced by vapor deposition in the resin plate 20A. Notably, while in the mode shown in the figure, irradiation with laser light is performed with respect to the vapor deposition mask preparation body 70 placed on the processing stage 75, the processing stage 75 is an arbitrary configuration in the method for producing a vapor deposition mask according to an embodiment of the present disclosure, and the resin mask openings 25 may be formed without the vapor deposition mask preparation body 70 placed on the processing stage 75.

A laser apparatus used in this step is not specially limited but a conventionally known laser apparatus is sufficient to be used. Moreover, the pattern to be produced by vapor deposition in the specification of the present application means a pattern to be produced using the vapor deposition mask, and, for example, when the vapor deposition mask is used for forming an organic layer of an organic EL element, it is the shape of the organic layer.

<Step of Fixing Vapor Deposition Mask Preparation Body to Frame>

The method for producing a vapor deposition mask according to an embodiment of the present disclosure may include a step of fixing the vapor deposition mask preparation body 70 to a frame, between arbitrary steps before forming the resin mask openings 25, or after these steps. While this step is an arbitrary step in the method for producing a vapor deposition mask of an embodiment of the present invention, by beforehand fixing the vapor deposition mask preparation body 70 to a frame in the stage before irradiation with laser light to form the resin mask openings 25 in the resin plate 20A, an attachment error arising in fixing the obtained vapor deposition mask 100 to a frame can be reduced. Notably, in place of fixing the vapor deposition mask preparation body 70 to a frame, after fixing, to a frame, a stacked body in which the metal layer 10 is partially provided on one surface of the resin plate 20A, or a stacked body in which the metal plate 10A for obtaining the metal layer 10 is provided on one surface of the resin plate 20A, the protective sheet 30 may be provided on the other surface of the resin plate 20A in the stacked body.

Fixation of the vapor deposition mask preparation body to a frame may be performed on the surface of the frame or may be performed on the lateral face of the frame.

Notably, while when laser processing is performed in the state where the vapor deposition mask preparation body 70 is fixed to a frame, depending on the fixing mode of the vapor deposition mask preparation body 70 to the frame, a gap arises between the vapor deposition mask preparation body 70 and the processing stage 75, or a gap microscopically arises due to insufficient close contact between the vapor deposition mask preparation body 70 and the processing stage 75, since in the vapor deposition mask preparation body 70, the protective sheet 30 is provided on the other surface of the resin plate 20A, the presence of the protective sheet 30 enables deterioration in strength of the resin plate 20A and out-of-focus blur that can arise due to the gap between the resin plate 20A and the processing stage 75 to be prevented. Accordingly, the method for producing a vapor deposition mask according to an embodiment of the present disclosure is particularly preferable in the case where the resin mask openings 25 are formed in the state where the vapor deposition mask preparation body 70 is fixed to a frame.

<Step of Peeling Off Protective Sheet>

As shown in FIG. 6(c), this step is a step of peeling off and removing the protective sheet 30 from the resin mask 20 after the resin mask openings 25 are formed in the resin plate 20A of the vapor deposition mask preparation body 70 to obtain the resin mask 20. In other words, it is a step of peeling off and removing the protective sheet 30 from the vapor deposition mask. Via this step, the vapor deposition mask 100 in which the metal layer 10 is partially positioned on the resin mask 20 in which the resin mask openings 25 corresponding to a pattern to be produced by vapor deposition are formed is obtained.

As described above, since in the method for producing a vapor deposition mask according to an embodiment of the present disclosure, the protective sheet 30 with peel strength not less than about 0.0004 N/10 mm and less than about 0.2 N/10 mm in conformity with JIS Z-0237:2009 is provided on the other surface of the resin plate 20A, the protective sheet 30 can be peeled off simply from the resin mask 20 in which the resin mask openings 25 are formed only by lifting the protective sheet 30 without other separate processing such, for example, as dissolving processing or UV processing for removing the protective sheet. Moreover, by setting the upper limit value of the peel strength to be less than about 0.2 N/10 mm, stress on the resin plate 20A can be suppressed from being exerted when peeling off the protective sheet 30.

Notably, when the protective sheet with peel strength not less than about 0.2 N/10 mm in conformity with JIS Z-0237:2009 is provided on the other surface of the resin plate 20A, stress exerted on the resin plate 20A is too high, which causes dimension displacement and positional displacement to tend to arise in the resin mask openings 25 formed in the resin plate 20A in the step of forming the resin mask openings. Moreover, peeling traces and the like tend to arise on the other surface of the resin plate 20A.

Moreover, even when in the step of forming the resin mask openings 25, "rubble" of the resin plate 20A sticks to the surface and the like of the protective sheet 30 due to decomposition of the resin plate 20A, this "rubble" can be peeled off and removed in this step along with the protective sheet 30. Moreover, in the case where the protective sheet 30 with self-adsorption is used as the protective sheet 30, the surface of the resin plate 20A (resin mask 20) in which the resin mask openings 25 are formed is not contaminated with the material of the protective sheet 30 and the like when the protective sheet 30 is peeled off from the resin plate 20A, and cleaning processing or the like is not needed.

According to the method for producing a vapor deposition mask according to an embodiment of the present disclosure described above, the presence of the protective sheet 30 enables a vapor deposition mask in which the metal layer 10 is partially provided on the resin mask 20 including the resin mask openings 25 with high definition to be produced in an excellent yield.

Next, predominance of the method for producing a vapor deposition mask according to an embodiment of the present disclosure, the method including: forming resin mask openings in the resin plate 20A with respect to the vapor deposition mask preparation body in which a protective sheet with peel strength not less than about 0.0004 N/10 mm and less than about 0.2 N/10 mm in conformity with JIS Z-0237:2009 is provided on the other surface of the resin plate 20A of the vapor deposition mask preparation body 70; and, after that, peeling off the protective sheet from a resin mask in which the resin mask opening have been formed, is described.

Each support member-integrated protective sheet presented in Table 1 below (samples 1 to 7) was pasted on the other surface of a resin plate of a vapor deposition mask preparation body such that the resin plate and the protective sheet opposed each other, the resin mask openings 25 were formed by irradiation with laser light from the metal layer side, and laser durability of the protective sheet and the presence or absence of burrs and rubble, in this stage, were examined. Moreover, after the laser processing, peelability in the occasion when the protective sheet was peeled off from the resin plate (resin mask in which the resin mask openings were formed) was also examined. Notably, for sample A, the resin mask openings were formed in the resin plate without providing a protective sheet. Moreover, for samples 6 and 7, only evaluation of peelability was performed.

In each vapor deposition mask preparation body used, a metal layer (invar material, 40 µm of thickness) was partially provided on one surface of a resin plate (polyimide resin, 5 µm of thickness), and each support member-integrated protective sheet presented in Table 1 below was provided on the other surface of the resin plate. For laser processing, YAG laser with 355 nm of wavelength was used. Table 1 below presents thicknesses of a support member and a protective sheet constituting each support member-integrated protective sheet, and the transmittance of each protective sheet at 355 nm of wavelength. Measurement of peel strength was in conformity with JIS Z-0237:2009, and was performed by using a test plate obtained by pasting a test tape (polyimide film (polyimide tape 5413, 3M Japan Limited) having a pressure-sensitive adhesive agent on its surface) on a stainless steel plate such that the stainless steel plate and the pressure-sensitive adhesive agent opposed each other, pasting each protective sheet as a test piece (samples 1 to 7) on this polyimide film of the test plate, and measuring peel strength (relative to polyimide) in the occasion when the protective sheet as the test piece was peeled off at 180° from the polyimide film as the test plate with an electromechanical universal testing instrument (5900 series, Instron Japan Company Limited). Table 1 presents the evaluation results.

Moreover, in order to show relation between the thickness of the protective sheet provided on the other surface of the resin plate 20A and damage that the protective sheet suffered in the laser processing, sample B was set by forming a layer with 1 µm of thickness and 1% of transmittance at 355 nm of wavelength (layer not including self-adsorption) on the other surface of the resin plate 20A by coating. Moreover, sample C was set by forming a layer with 0.5 µm of thickness and 1% of transmittance at 355 nm of wavelength (layer not including self-adsorption) on the other surface of the resin plate 20A by coating. For these samples B and C, evaluation of the presence or absence of burrs and rubble, and durability of the coating layer in the laser processing were performed. Notably, as the material of the coating layer, a polyimide resin (PHOTONEECE DL-1602, Toray Industries Inc.) was used.

Report of Tests
a) Name of the Standard: JIS Z-0237:2009
b) Test Method: Method 2, the tape was a polyimide tape 5413 (3M Japan Limited)
c) Identification of Samples: Product Numbers (Product Names) presented in the table
d) Test Date and Test Site: September 3 and December 7 in 2015, Kashiwa City, Chiba Prefecture
e) Test Results: Interface Breakage
Miscellaneous) Measurement Apparatus: Electromechanical Universal Testing Instrument (5900 series, Instron Japan Company Limited)

As apparent from the results in Table 1 below, according to samples 1 to 5 for which the resin mask openings were formed in the resin plate 20A with respect to the vapor deposition mask preparation body in which the protective sheet 30 was provided on the other surface of the resin plate 20A, as compared with sample A for which the resin mask openings were formed in the resin plate 20A without providing the protective sheet 30 on the other surface of the resin plate 20A, burrs and rubble could be suppressed from arising, and the resin mask openings with high definition could be formed. Moreover, as compared with sample 7 for which a protective sheet with peel strength being about 0.2 N/10 mm in conformity with JIS Z-0237:2009 was provided on the other surface of the resin plate 20A, according to 1 to 6 for which a protective sheet with peel strength not less than about 0.0004 N/10 mm and less than about 0.2 N/10 mm in conformity with JIS Z-0237:2009 was provided on the other surface of the resin plate 20A, damage which the resin mask suffered could be suppressed. Moreover, for sample B for which a coating layer with 1 µm of thickness was provided in place of the protective sheet with self-adsorption, cracks arose in the coating layer in laser processing, and for sample C for which a coating layer with 0.5 µm of thickness was provided, the coating layer broke in laser processing. Moreover, for samples B and C for which the transmittance was set to be less than about 70%, the coating layer was processed with laser light by the coating layer absorbing the laser light, which caused burrs and rubble due to this to slightly arise.

TABLE 1

| | | Protective Sheet | | | | |
|---|---|---|---|---|---|---|
| | | Resin Material | | Thickness (µm) | Transmittance (355 nm)(%) | Peel Force (Relative to Polyimide) N/10 mm | Support Member |
| Sample 1 | Urethane-Based | UA-3004ASL Sumiron Co. Ltd. | 7 | 83 | 0.008 | PET 38 µm |
| Sample 2 | Urethane-Based | MASTACK ZUPF-5001 Fujimori Kogyo Co. Ltd. | 10 | 83 | 0.016 | PET 50 µm |
| Sample 3 | Acrylic | EC-9000ASL Sumiron Co. Ltd. | 7 | 82 | 0.024 | PET 38 µm |
| Sample 4 | Silicone-Based | FIXFILM STD1 Fujicopian Co. Ltd. | 25 | 79 | 0.004 | PET 25 µm |

TABLE 1-continued

| | | | | | | |
|---|---|---|---|---|---|---|
| Sample 5 | Acrylic | MASTACK PC-542PA Fujimori Kogyo Co. Ltd. | 4 | 82 | 0.04 | PET 50 μm |
| Sample 6 | Acrylic | EC-625 Sumiron Co. Ltd. | — | — | 0.1 | Polyethylene 55 μm (including Thickness of Protective Sheet) |
| Sample 7 | Acrylic | PP40-R-KG2 Nichiei Kakoh Co. Ltd. | — | — | 0.2 | Polypropylene 40 μm |
| Sample A | | Without Protective Sheet | | | | |
| Sample B | | Coating Layer without Self-Adsorption | 1 | 1 | — | — |
| Sample C | | Coating Layer without Self-Adsorption | 0.5 | 1 | — | — |

| | Adsorption/Air Escape Ability | Laser Durability (Presence or Absence of Deformation of Protective Sheet) | Presence or Absence of Burrs and Rubble | Peelability |
|---|---|---|---|---|
| Sample 1 | OK/Remaining Air (Little) | No Breakage Cracks | None | Excellent |
| Sample 2 | OK/Remaining Air (Little) | No Breakage Cracks | None | Excellent |
| Sample 3 | OK/Remaining Air (Medium) | No Breakage Cracks | None | Damage on Resin Mask (Little) |
| Sample 4 | OK/Remaining Air (None) | No Breakage Cracks | None | Excellent |
| Sample 5 | OK/Remaining Air (Much) | No Breakage Cracks | Slight Burrs and Rubble Arise | Damage on Resin Mask (Little) |
| Sample 6 | OK/Remaining Air (Little) | — | — | Damage on Resin Mask (Medium) |
| Sample 7 | OK/Remaining Air (Little) | — | — | Damage on Resin Mask (Much) |
| Sample A | — | — | Many Burrs and Rubble Arise | — |
| Sample B | — | Cracks Arise in Coating Layer | Slight Burrs and Rubble Arise | Disability of Peeling-Off |
| Sample C | — | Coating Layer Breaks | Slight Burrs and Rubble Arise | Disability of Peeling-Off |

<Another Example of Method for Producing Vapor Deposition Mask>

As above, while a method for producing a vapor deposition mask according to an embodiment of the present disclosure has been exemplarily described by an example of using the vapor deposition mask preparation body 70 in which the protective sheet 30 with peel strength not less than about 0.0004 N/10 mm and less than about 0.2 N/10 mm in conformity with JIS Z-0237:2009 is provided on the other surface of the resin plate 20A for obtaining the resin mask 20, in place of this method for producing a vapor deposition mask, the vapor deposition mask may be produced using the vapor deposition mask preparation body 70 in which the protective sheet 30 with self-adsorption and peelability is provided on the other surface of the resin plate 20A. According to the method for producing a vapor deposition mask of this mode, the similar effect to that of the method for producing a vapor deposition mask using the vapor deposition mask preparation body 70 in which the protective sheet 30 with peel strength not less than about 0.0004 N/10 mm and less than about 0.2 N/10 mm in conformity with JIS Z-0237:2009 is provided on the other surface of the resin plate 20A for obtaining the resin mask 20 as described above is achieved.

The method for producing a vapor deposition mask of this mode is different from the aforementioned method for producing a vapor deposition mask in using the vapor deposition mask preparation body 70 in which, in place of the protective sheet 30 with peel strength not less than about 0.0004 N/10 mm and less than about 0.2 N/10 mm in conformity with JIS Z-0237:2009, the protective sheet 30 with self-adsorption and peelability is provided as the protective sheet 30. Accordingly, for the method for producing a vapor deposition mask of this mode, the aforementioned expression of the protective sheet 30 with peel strength not less than about 0.0004 N/10 mm and less than about 0.2 N/10 mm in conformity with JIS Z-0237:2009 only has to be replaced by the protective sheet 30 with self-adsorption and peelability.

As the material of the protective sheet 30 with self-adsorption and peelability, for example, an acrylic resin, a silicone-based resin, a urethane-based resin, a polyester resin, an epoxy resin, a polyvinyl alcohol resin, a cycloolefin resin, a polyethylene resin and the like can be cited. Above all, the protective sheet preferably contains any one or both of a silicone-based resin and a urethane-based resin, and the protective sheet 30 still preferably contains a silicone-based resin.

<Frame-Equipped Vapor Deposition Mask>

Figure 4A:
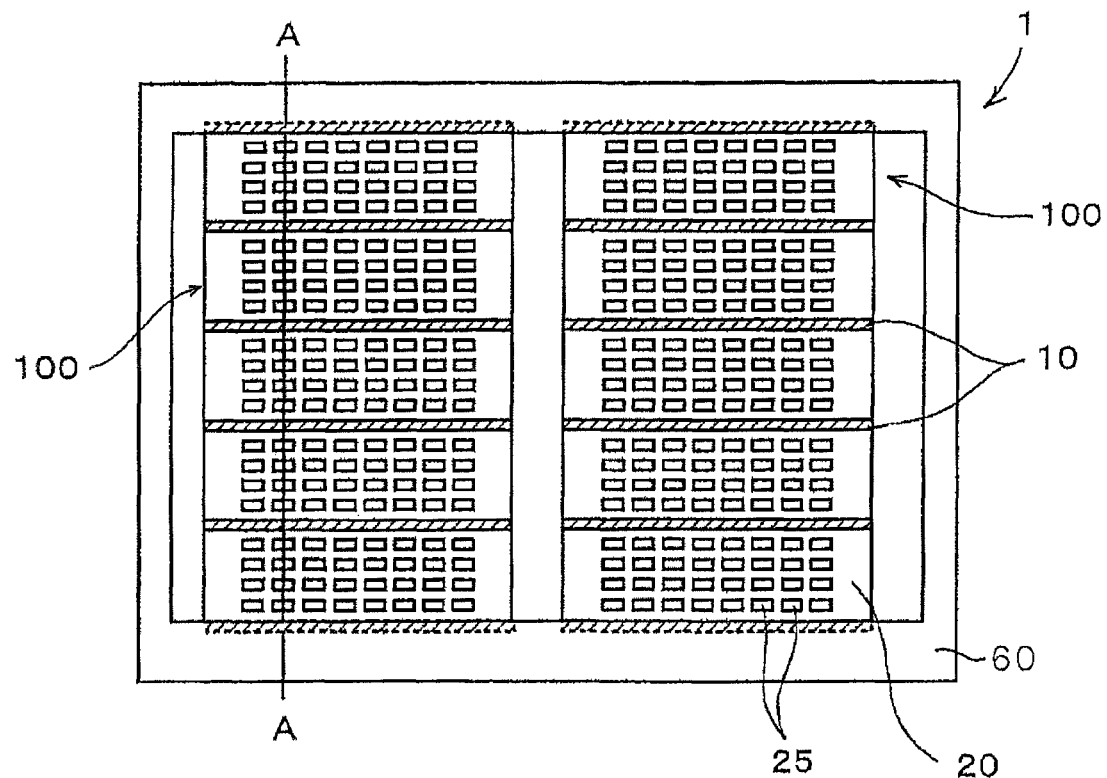
FIG. 4(a) is an elevation view exemplarily showing a frame-equipped vapor deposition mask according to an embodiment of the present disclosure as seen from the frame side in plan view.
Figure 4B:
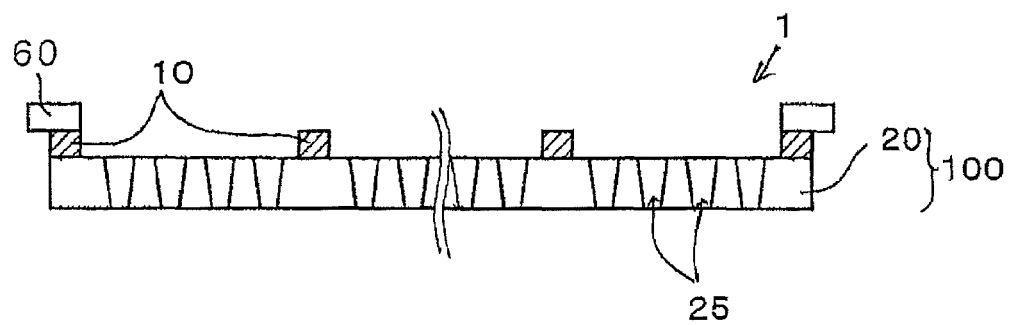
FIG. 4(b) is a schematic cross-sectional view in the A-A portion of FIG. 4(a).

FIG. 4(a) is an elevation view exemplarily showing a frame-equipped vapor deposition mask according to an embodiment of the present disclosure as seen from the frame side in plan view, and FIG. 4(b) is a schematic cross-sectional view in the A-A portion of FIG. 4(a). Notably, a part about the center of the frame-equipped vapor deposition mask in FIG. 4(b) is omitted.

As shown in FIGS. 4(a) and 4(b), a frame-equipped vapor deposition mask 1 according to an embodiment of the present disclosure includes: the vapor deposition mask 100 according to an embodiment of the present disclosure shown in FIG. 1 above; and the frame 60, wherein the vapor deposition mask 100 is fixed to the frame 60 via the metal layer 10. Since the vapor deposition mask 100 has been already described, hereafter, the frame 60 is mainly described.

(Frame)

The frame 60 constituting the frame-equipped vapor deposition mask 1 according to an embodiment of the present disclosure is not specially limited but can be properly selected from conventionally known frames to be used. For example, as shown in FIG. 4, the frame 60 is a substantially rectangular frame member, and as its material, a metal material, a glass material, a ceramic material or the like may be used. Moreover, the thickness of the frame 60 is not specially limited but preferably within a range not less than about 10 mm and not more than about 100 mm in view of rigidity and the like. The width between the inner circumferential end face of the opening of the frame and the outer circumferential end face of the frame is not specially limited as long as it is a width with which the frame can be fixed to the metal layer 10 of the vapor deposition mask, for example, a width within a range not less than about 10 mm and not more than about 300 mm can be exemplarily cited.

A method of fixing the vapor deposition mask 100 to such a frame 60 is not specially limited, but when the frame 60 is constituted of a metal material, the fixation may be performed by welding the metal layer 10 in the vapor deposition mask 100 and the frame 60 together.

Meanwhile, when the metal layer 10 is arranged only on the non-peripheral edge part of the resin mask 20 as in the vapor deposition mask 100 shown in FIG. 2, the vapor deposition mask 100 and the frame may be fixed together by bonding the resin mask 20 and the frame together with an adhesive agent or the like.

Furthermore, when the metal layers 10 are scattered on the resin mask 20 as in the vapor deposition mask 100 shown in FIG. 3, the vapor deposition mask 100 and the frame may be fixed together by welding the metal layer 10 and the frame together, and meanwhile, bonding the resin mask 20 and the frame together with an adhesive agent or the like.

Figure 12:
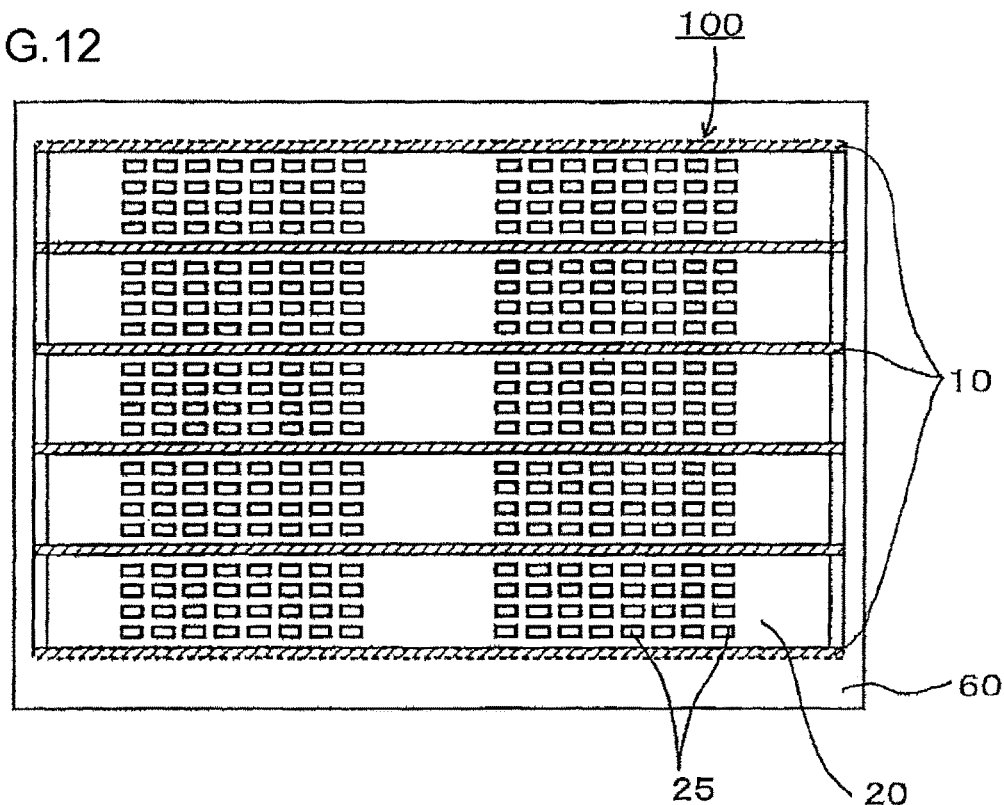
FIG. 12 is an elevation view exemplarily showing a vapor deposition mask according to another embodiment of the present disclosure as seen from the side on which a metal layer is formed in plan view.

Notably, while in FIG. 4, two vapor deposition masks 100 according to an embodiment of the present disclosure shown in FIG. 1 are fixed to the frame 60, not limited to this, one vapor deposition mask 100 may be fixed to one frame, or three or more vapor deposition masks may be fixed to one frame. For example, as shown in FIG. 12, one vapor deposition mask 100 obtained by integrating a plurality of vapor deposition masks may be fixed to the frame 60. Notably, in the mode shown in FIG. 12, all or parts of the end parts of the metal layers 10 extending in the longitudinal direction are in contact with the frame (all the end parts of the metal layers 10 in the longitudinal direction are in contact with the frame 60 in the mode shown in the figure), and not only at the metal layers 10 arranged close to the upper side and the lower side of the vapor deposition mask 100 but also at parts or all of the end parts of the metal layers 10, the metal layers 10 and the frame are fixed together. Notably, as to the metal layers 10 extending in the longitudinal direction, a mode where their end parts may be not in contact with the frame 60 may be set, and the vapor deposition mask 100 and the frame may be fixed together only by its fixation to the metal layers 10 arranged close to the upper side and the lower side of the vapor deposition mask 100.

Figure 13:
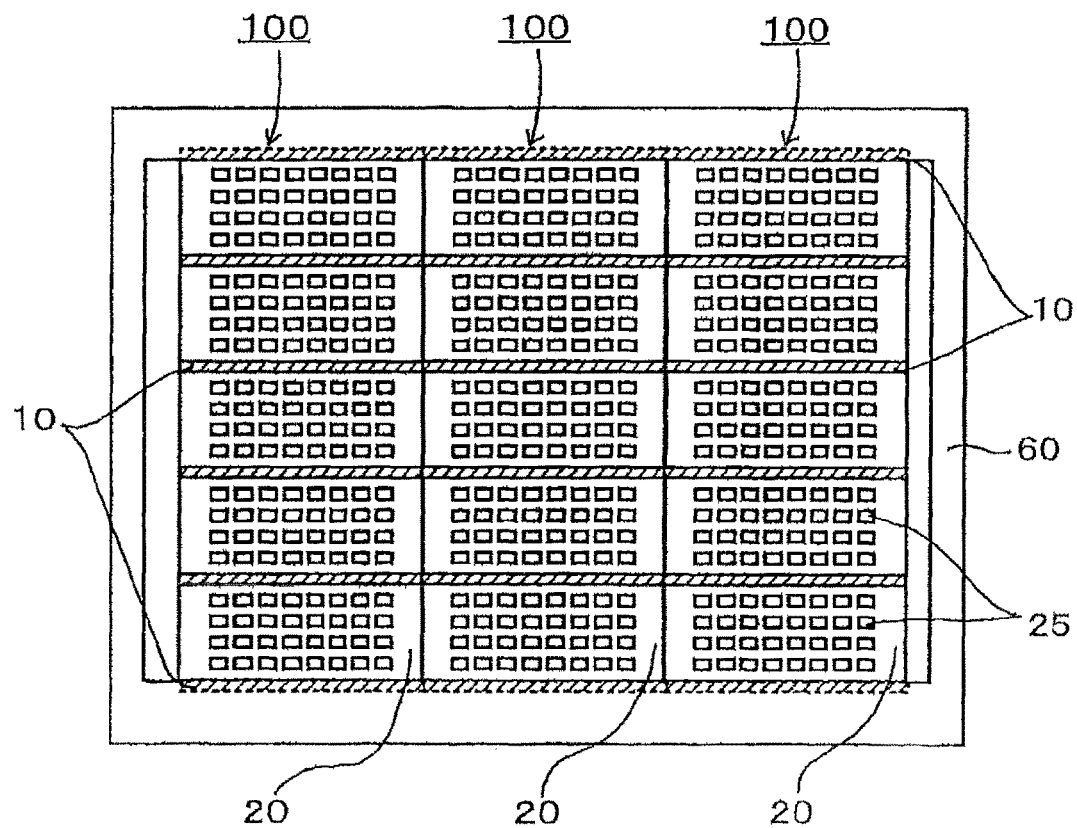
FIG. 13 is an elevation view exemplarily showing a vapor deposition mask according to another embodiment of the present disclosure as seen from the side on which a metal layer is formed in plan view.

Moreover, while in the mode shown in FIG. 4, two vapor deposition masks are arranged to be spaced from each other, as shown in FIG. 13, three or more vapor deposition masks 100 may be arranged (three vapor deposition masks in the mode shown in the figure). In this case, the plurality of vapor deposition masks 100 may be arranged so as not to be spaced from their adjacent vapor deposition masks 100, or may be arranged to be spaced from one another (the three vapor deposition masks are arranged so as not to be spaced from one another in the mode shown in FIG. 13). Moreover, while in the mode shown in FIG. 13, a mode where the end parts of the metal layers 10 of the vapor deposition masks 100 that are positioned on both ends in the longitudinal direction out of the vapor deposition masks 100 fixed to the frame are not in contact with the frame is set, a mode where the end parts of the metal layers 10 of the vapor deposition masks 100 that are positioned on both ends in the longitudinal direction are in contact with the frame may be set (not-shown).

<Vapor Deposition Method Using Vapor Deposition Mask>

The vapor deposition method used for forming a vapor deposition pattern using the vapor deposition mask 100 and the frame-equipped vapor deposition mask 1 according to the present disclosure described above is not specially limited but, for example, physical vapor deposition (PVD) methods such as a reactive sputtering method, a vacuum vapor deposition method, ion plating, and an electron beam vapor deposition method, chemical vapor deposition (CVD) methods such as thermal CVD, plasma CVD and photo-CVD methods, and the similar method can be cited. Moreover, a vapor deposition pattern can be formed using a conventionally known vacuum vapor deposition apparatus or the like.

<Method for Producing Organic Semiconductor Element>

Next, a method for producing an organic semiconductor element according to an embodiment of the present disclosure (hereinafter referred to as method for producing an organic semiconductor element of the present disclosure) is described. The method for producing an organic semiconductor element of the present disclosure includes a step of forming a vapor deposition pattern on a vapor deposition target using a vapor deposition mask or a frame-equipped vapor deposition mask, wherein in the step of forming the vapor deposition pattern, the vapor deposition mask or the frame-equipped vapor deposition mask of the present disclosure described above is used.

The step of forming the vapor deposition pattern by a vapor deposition method using the vapor deposition mask or the frame-equipped vapor deposition mask is not specially limited but includes an electrode forming step, an organic layer forming step, a counter electrode forming step, a sealing layer forming step and the like in which electrodes are formed on a substrate, and in any of the steps, a vapor deposition pattern is formed using the vapor deposition pattern forming method. For example, in the case where the vapor deposition pattern forming method is applied to each of light-emitting layer forming steps for colors of R (red), G (green) and B (blue) in an organic EL device, vapor deposition patterns are formed for light-emitting layers for the colors on the substrate. Notably, the method for producing an organic semiconductor element of the present disclosure is not limited to be applied to these steps, but to any steps in conventionally known production of an organic semiconductor element.

According to the method for producing an organic semiconductor element of the present disclosure described above, vapor deposition of forming an organic semiconductor element can be performed in the state where the frame-equipped vapor deposition mask and the vapor deposition target are brought into close contact with each other without a gap, and an organic semiconductor element with high definition can be produced. As organic semiconductor elements produced by the method for producing an organic semiconductor element of the present disclosure, for example, organic layers, light-emitting layers, cathode electrodes and the like of organic EL elements can be cited. In particular, the method for producing an organic semiconductor element of the present disclosure can be preferably used for production of R (red), G (green) and B (blue) light-emitting layers of organic EL elements which require pattern precision with high definition.

<Method for Producing Organic EL Display>

Next, a method for producing an organic EL display (organic electroluminescence display) according to an embodiment of the present disclosure (hereinafter referred to as method for producing an organic EL display according to the present disclosure) is described. In the method for producing an organic EL display according to the present disclosure, the organic semiconductor element produced by the method for producing an organic semiconductor element according to the present disclosure described above is used in a step of producing the organic EL display.

Figure 5A:
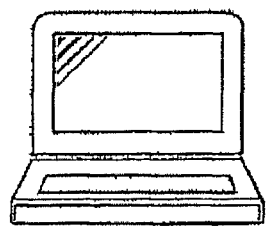
FIG. 5 shows diagrams showing examples of devices including organic EL displays.
Figure 5B:
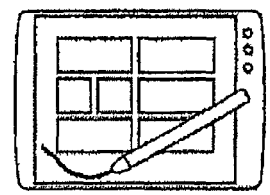
Figure 5C:
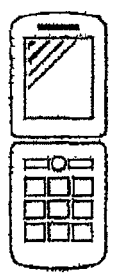
Figure 5D:
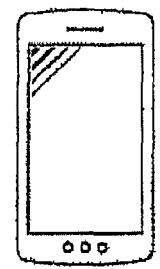
Figure 5E:
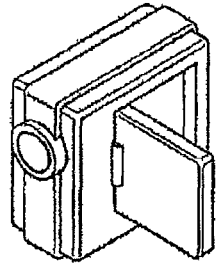
Figure 5F:
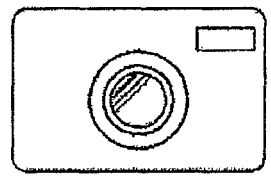
Figure 5G:
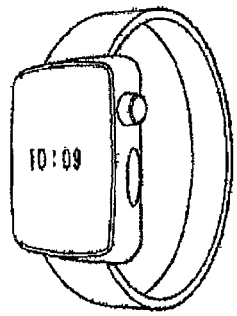

As the organic EL displays in which the organic semiconductor elements produced by the aforementioned method for producing an organic semiconductor element according to the present disclosure are used, for example, organic EL displays used for a notebook-sized personal computer (refer to FIG. 5(a)), a tablet terminal (refer to FIG. 5(b)), a mobile phone (refer to FIG. 5(c)), a smartphone (refer to FIG. 5(d)), a video camera (refer to FIG. 5(e)), a digital camera (refer to FIG. 5(f)), a smartwatch (refer to FIG. 5(g)) and the like can be cited.

REFERENCE SIGNS LIST

1 Frame-equipped vapor deposition mask
10 Metal layer
20 Resin mask
25 Resin mask opening
30 Protective sheet
60 Frame
70 Vapor deposition mask preparation body
100 Vapor deposition mask

The invention claimed is:

1. A frame-equipped vapor deposition mask comprising:
a frame and a vapor deposition mask fixed to the frame, wherein
the vapor deposition mask comprises a resin mask including a resin mask opening corresponding to a pattern to be produced by vapor deposition, and isolated multiple metal layers partially positioned on one surface of the resin mask and being completely detached from one another,
the resin mask has a quadrangular shape including a long side and a short side,
on one surface of the resin mask, at least one of the metal layers is arranged at each end of the resin mask in the short side direction, and is a band-shaped body extending along the long side of the resin mask, and
on said one surface of the resin mask, a region thereof overlapping the frame is defined as a peripheral edge part and a region not overlapping the frame is defined as a non-peripheral edge part, and said at least one of the metal layers is positioned at least on a portion of the peripheral edge part and on at least a portion of the non-peripheral edge part, and the entirety of a long side of said at least one of the metal layers overlaps the peripheral edge part.

2. A frame-equipped vapor deposition mask preparation body for producing a frame-equipped vapor deposition mask comprising:
a frame and a vapor deposition preparation body mask fixed to the frame, wherein
the vapor deposition mask preparation body comprises a resin plate before a resin mask opening corresponding to a pattern to be produced by vapor deposition is formed, and isolated multiple metal layers partially positioned on one surface of the resin plate and being completely detached from one another,
the resin plate has a quadrangular shape including a long side and a short side,
on one surface of the resin plate, at least one of the metal layers is arranged at each end of the resin plate in the short side direction, and is a band-shaped body extending along the long side of the resin plate, and
on said one surface of the resin plate, a region thereof overlapping the frame is defined as a peripheral edge part and a region not overlapping the frame is defined as a non-peripheral edge part, and said at least one of the metal layers is positioned at least on a portion of the peripheral edge part and on at least a portion of the non-peripheral edge part, and the entirety of a long side of said at least one of the metal layers overlaps the peripheral edge part.

3. A vapor deposition pattern forming method for forming a vapor deposition pattern on a vapor deposition target using a frame-equipped vapor deposition mask, wherein
the frame-equipped vapor deposition mask is the frame-equipped vapor deposition mask according to claim 1.

4. A method for producing an organic semiconductor element, comprising:
a vapor deposition pattern forming step of forming a vapor deposition pattern on a vapor deposition target using a frame-equipped vapor deposition mask, wherein
the frame-equipped vapor deposition mask used in the vapor deposition pattern forming step is the frame-equipped vapor deposition mask according to claim 1.

5. A method for producing an organic EL display, wherein the organic semiconductor element produced by the method for producing an organic semiconductor element according to claim 3 is used.

* * * * *